United States Patent [19]
Ogura

[11] Patent Number: 5,600,595
[45] Date of Patent: Feb. 4, 1997

[54] NON-VOLATILE SEMICONDUCTOR DEVICE WITH AN ELECTRICALLY ERASABLE AND PROGRAMMABLE READ ONLY MEMORY SHOWING AN EXTREMELY HIGH SPEED BATCH ERASURE OPERATION

[75] Inventor: Naoyuki Ogura, Tokyo, Japan

[73] Assignee: NEC Corporation, Tokyo, Japan

[21] Appl. No.: 526,907

[22] Filed: Sep. 12, 1995

[30] Foreign Application Priority Data

Sep. 12, 1994 [JP] Japan .................................. 6-242390

[51] Int. Cl.$^6$ ................................................. G11C 13/00
[52] U.S. Cl. ..................................... 365/185.33; 365/218
[58] Field of Search ............................. 365/185.33, 218

[56] References Cited

U.S. PATENT DOCUMENTS 5,341,339  8/1994  Wells ................................. 365/185.33
5,369,615  11/1994  Harari et al. ...................... 365/185.33
5,410,511  4/1995  Michiyama ........................ 365/185.33

*Primary Examiner*—Terrell W. Fears
*Attorney, Agent, or Firm*—Young & Thompson

[57] ABSTRACT

A non-volatile semiconductor memory with an electrically erasable and programmable read only memory showing a high speed batch erasure operation is provided wherein applications of erasure pulse signals onto the memory cells are continued until the number of times of the erasure pulse signal applications made corresponds to a predetermined number already set before commencement of the erasure pulse signal applications, the predetermined number being set to correspond to an estimated number of times of the erasure pulse signal applications necessary for completing the batch erasure operation for subsequently repeating a set of an additional erasure pulse signal application onto the memory cells and a verifying process for verifying erasure states of all the memory cells until there is verified the fact that all the memory cells have been in erasure states.

6 Claims, 8 Drawing Sheets

5,600,595

NON-VOLATILE SEMICONDUCTOR DEVICE WITH AN ELECTRICALLY ERASABLE AND PROGRAMMABLE READ ONLY MEMORY SHOWING AN EXTREMELY HIGH SPEED BATCH ERASURE OPERATION

BACKGROUND OF THE INVENTION

The invention relates to a non-volatile semiconductor memory device with an electrically erasable and programmable read only memory showing a high speed batch erasure operation.

The electrically erasable and programmable read only memory shows a batch erasure of all informations stored in all of memory cells provided therein by receiving high voltage erasing signals for a predetermined time sufficient for implementation of the batch erasure. The batch erasure means an erasure at one time of all informations stored in all the memory cells. The batch erasure operation should be implemented to prevent an excess application of the erasure signal to the memory cells after all the informations of the memory cells have already been erased. If the erasure signal is still kept applied to the memory cells after all the informations stored therein were erased, all the memory cells comes into an excess erased state wherein a threshold voltage of the memory cells has a negative value thereby the memory cells become unoperational and unusable. To prevent this problem, it is required to apply the erasure signal to the memory cells together with confirming the erasure state of the memory cells.

In the prior art to which the invention pertains, it has been proposed to implement repeating and alternating short time applications of the erasure signals and checking operations of the erasure state so that the erasure signal application is discontinued when erasure of all informations of the all memory cells is confirmed. In view of prevent even a slight excess erasure state of the memory cells, it is preferable to set the time as short as possible during which the erasure signal is applied to the memory cells. In this case, This leads to a large number of applications of the erasure signals to the memory cells. Such repeat of the application of the high voltage erasure signals many times may cause a deterioration of the erasure properties of the memory cells. The deterioration in the erasure properties of the memory cells requires a longer time application of the high voltage erasure signal to the memory cells. The progress of the deterioration in the erasure properties of the memory cells renders the memory cells approach to a termination of its life-time, resulting in an impossibility of the completion of the erasure of any informations stored in all the memory cells even a possible long time application of the high voltage erasure signal to the memory cells is implemented.

To recognize the life-time of the memory cells, it has already been proposed to count the number of times of the applications of the high voltage erasure signals to the memory cells, one technique of which is disclosed in the Japanese Laid-open Patent Application No. 4-255997. The on-volatile semiconductor memory device with the electrically erasable and programmable read only memory is further provided with a counter for counting the number of times of the erasure/write operations as well as an additional memory for storing the counted number of times thereof. A configuration of this conventional non-volatile semiconductor memory device will hereinafter be described with reference to FIG. 1.

A non-volatile semiconductor memory device 40 includes an electrically erasable and programmable read only memory 1 showing a batch erasure operation wherein all informations stored in all of memory cells provided in the electrically erasable and programmable read only memory 1 are erased one time. The non-volatile semiconductor memory device 40 further includes first and second erasing/writing signals generators 3 and 4, a control unit 30 for controlling operations of individual elements constituting the non-volatile semiconductor device, an erasing/writing times-counter 31 for counting the number of times of the erasure/write operations, an erasing/writing times-memory 32 for storing the counted number of times of the erasure/write operations and an erasure pulse application times-counter 5.

The electrically erasable and programmable read only memory 1 is coupled to a data bus 12 so that informations stored in a specified one in the memory cells comes into a readout to output onto the data bus 12 which is further coupled to a central processing unit 39 as illustrated in FIG. 2. The electrically erasable and programmable read only memory 1 is coupled to the central processing unit 39 to receive a readout instruction signal 10. The electrically erasable and programmable read only memory 1 is also coupled to the control unit 30 to receive a first readout signal 16 and address informations transferred on an internal address bus 15. When the electrically erasable and programmable read only memory 1 receives any one of the readout instruction signal 10 and the first readout signal 16, the electrically erasable and programmable read only memory 1 performs a readout, onto the data bus 12, of an information stored in a memory cell specified according to the address data that the electrically erasable and programmable read only memory 1 received via the internal data bus 15. The electrically erasable and programmable read only memory 1 is also coupled to the first erasing/writing signals generator 3 to receive a first writing signal 21 and a first erasing signal 22. When the electrically erasable and programmable read only memory 1 receives the first writing signal 21, the electrically erasable and programmable read only memory 1 fetches informations on the data bus 12 and stores the fetched informations into a memory cell specified according to the address data that the electrically erasable and programmable read only memory 1 received via the internal data bus 15. When the electrically erasable and programmable read only memory 1 receives the first erasing signal 21, the electrically erasable and programmable read only memory 1 implements the batch erasing operation to erase all informations stored in all the memory cells regardless of the address informations that the electrically erasable and programmable read only memory 1 received via the internal data bus 15.

The control unit 30 is coupled to the central processing unit 39 to receive a writing instruction signal 8 and an erasing instruction signal 9. The control unit 30 is coupled to the central processing unit 39 via an external address bus 11 on which address informations are transferred between the control unit 30 and the central processing unit 39. The control unit 30 is also coupled to the data bus 12 to output the data onto the data bus 12 and fetch the data from the data bus 12. The control unit 30 is coupled to the erasing pulse application times counter 5 to receive erasing pulse application times count data therefrom via a count data bus 25 as well as to supply an initialization signal 13, an erasure control signal 18 and a selective signal 19 independently to the erasing pulse application times counter 5. The selective signals comprise binary digit signals having valid and invalid levels. When the control unit 30 receives no input of the erasing instruction signal 9, the control unit 30 renders address data oft he external address data bus 11 directly output onto the internal address bus 15 on which the address data are transferred into the electrically erasable and programmable read only memory 1. The control unit 30 is further coupled to the first erasing/writing signals generator 3 to supply a writing control signal 17, the erasure control signal 18 and the selective signal 19 into the first erasing/ writing signals generator 3. The control unit 30 is furthermore coupled to the second erasing/writing signals generator 4 to supply a writing control signal 17, the erasure control signal 18 and the selective signal 19 into the second erasing/ writing signals generator 4. When the control unit 30 receives the input of the write instruction signal 8, the control unit 30 renders the selective signal come into the valid level and further supply the write control signal to the first erasing/writing signals generator 3 for a time corresponding to the predetermined time during which one of the erasing pulse signals is applied to the memory cells in the electrically erasable and programmable read only memory 1. When the control unit 30 receives the input of the erasing instruction signal 9, the control unit 30 shows, with reference to erasure pulse application times data on the count data bus 25, outputs of the address informations onto the internal address bus 15, the first readout signal 16, the write control signal 17, the erasing control signal 18, the selective signal 19, a second readout signal 20, the initialization signal 13, an initial value set signal 33 and an erasure/write completion signal 34. The control unit 30 is coupled to the erasure/write times counter 31 to supply the initial value set signal 33 and the erasure/write completion signals 34 into the erasure/ write times counter 31. The control unit 30 is moreover coupled to the erasure/write times memory 32 to supply the second readout signal 20 into the erasure/write times memory 32.

The erasure/write times memory 32 is also coupled to the second erasure/write signals generator 4 to receive both a second write signal 23 and a second erasure signal 24 from the second erasure/write signals generator 4. The erasure/ write times memory 32 is further coupled to the erasure/ write times counter 31 to supply data, stored therein, as to the erasure/write times, namely the number of times of the erasure/write operations via an internal readout data bus 27 into the erasure/write times counter 31 as well as to receive informations counted by the erasure/write times counter 31 via an internal write data bus 26. The erasure/write times memory 32 is coupled to the central processing unit 39 to receive an erasure/write times readout instruction signal 35. When the erasure/write times memory 32 receives the erasure/write times readout instruction signal 35, the erasure/write times memory 32 shows an output of the data concerned with the onto the internal readout data bus 27. The erasure/write times memory 32 is moreover coupled to the data bus 12 to show an output of the data stored therein onto the data bus 12.

The first erasure/write signals generator 3 shows an output of the first write signal 21 only in a time duration when the selective signal 19 is kept in the valid level and the first erasure/write signals generator 3 is kept to receive an input of the write control signal 17. The first erasure/write signals generator 3 also shows an output of the first erasure signal 22 only in a time duration when the selective signal 19 is kept in the valid level and the first erasure/write signals generator 3 is kept to receive an input of the erasure control signal 18.

The second erasure/write signals generator 4 shows an output of the second write signal 23 only in a time duration when the selective signal 19 is kept in the invalid level and the second erasure/write signals generator 4 is kept to receive an input of the write control signal 17. The second erasure/write signals generator 4 also shows an output of the second erasure signal 24 only in a time duration when the selective signal 19 is kept in the invalid level and the second erasure/write signals generator 4 is kept to receive an input of the erasure control signal 18.

The erasing pulse application times counter 5 initializes the counting data stored therein when receiving the initialization signal 13. The erasing pulse application times counter 5 adds "1" into the existent count data only when the selective signal 19 is kept in the invalid level and the erasure pulse application times counter 5 receives the input of the erasure control signal 18 from the control unit 30. The erasure pulse application times counter 5 keeps to output the data as to the counted number of times of applications of the erasure pulse signals onto the count data bus 25 for keeping the control unit 30 informed of the count data.

When the erasure/write times counter 31 receives an input of the initial value set signal 33 supplied from the control unit 30, the erasure/write times counter 31 initializes data as to the number of times of the erasure/write operations to set the initialized data at the same value of the data fetched via the internal readout data bus 27 from the erasure/write times memory 32 which stores the data as to the counted number of times of the erasure/write operations. The erasure/write times counter 31 adds "1" to the counted data stored therein when receiving an input of the erasure/write completion signal 34. The erasure/write times counter 31 keeps to output the counted data stored therein onto the internal write data bus 26 which is then fetched by the erasure/write times memory 32 for subsequent storing therein.

The erasure/write times memory 32 outputs the data stored therein onto the internal readout data bus 27 when receiving the input of the second readout signal 20. The erasure/write times memory 32 stores the data fetched from the internal write data bus 26 when receiving the input of the second write signal 23. The erasure/write times memory 32 shows an erasure operation of the data stored therein when receiving the input of the second erasure signal 23. The erasure/write times memory 32 also outputs the data stored therein onto the data bus 12 when receiving an erasure/write times readout instruction signal 35 which is supplied from the central processing unit 39.

The following descriptions will focus on the batch erasure operation of the conventional non-volatile semiconductor memory device with reference to FIG. 3 which is illustrative of the steps involved in the batch erasure operations in the form of the flow chart. The batch erasure operation starts and then subsequent operations are implemented.

In a first step S101, the control unit 30 outputs the initialization signal 13 which is then transferred to the erasure pulse application numbers counter 5 thereby the erasure pulse application numbers counter 5 initialize the count data stored therein into "0".

In the second step S102, the control unit 30 outputs the initial value set signal 33 and the second readout signal 20 which are then transferred to the erasure/write times counter 31 and the erasure/write times memory 32 respectively. As a result, the erasure/write times memory 32 outputs the data stored therein onto the internal readout data bus 27 for transferring the data into the erasure/write times counter 31 so that the erasure/write times counter 31 fetches the count data supplied film erasure/write times memory 32 tier subsequent initialization to render the count data stored in the erasure/write times counter 31 correspond to the data fetched film the internal readout data bus 27.

In the third step S103, the control unit 30 switches the selective signal 19 into the valid level and further outputs the erasure control signal 18 fix a predetermined time duration which corresponds to a time unit during which one of the high voltage erasure pulses should be applied to the memory cell in the electrically erasable and programmable read only memory 1. As a result, the first erasure/write control signal generator 3 outputs the first erasure signal 22 only for the unit of the time duration to be transferred to the electrically erasable and programmable read only memory 1 so that the electrically erasable and programmable read only memory 1 performs the erasure operation for the unit of the time duration by application of the high voltage pulse to all of the memory cells provided in the electrically erasable and programmable read only memory 1. At time, the control unit 30 supplies the erasure control signal 18 to the erasure pulse application times counter 5 so that the erasure pulse application times counter 5 performs the counting operation by adding "1" into the counted data stored therein. The erasure pulse application times counter 5 outputs the counted data onto the count data bus 25 so that the currently counted data is kept to be transferred into the control unit 30. This means that the control unit 30 is kept informed of the currently counted data as to the number of times of applications of the high voltage erasure pulse signals.

In the fourth step S104, the control unit 30 outputs data as to a head address as a verify-address concerned with the batch erasure operation onto the internal address bus 15 so that the data as to the head address is then transferred to the electrically erasable and programmable read only memory 1. At the same time, the control unit 30 also outputs the first readout signal 16 which is transferred into the electrically erasable and programmable read only memory 1. At the same time, the control unit 30 also outputs the first readout signal 16 which is transferred into the electrically erasable and programmable read only memory 1.

In the fifth step S105, the electrically erasable and programmable read only memory 1 fetches the head address data of the address bus 15 to specify a memory cell according to the fetched head address data for subsequent output of data stored in the specified memory cell onto the data bus 12. The data of the specified memory cell is then transferred on the data bus 12 to the control unit 30. The control unit 30 fetches the data of the specified memory cell to verify whether the fetched data associated with the specified memory cell would be the erased-data or the data after the erasure was implemented. If the verified data would be the erased-data after the erasure operation, the subsequent step will be the step S106. If the verified data would not be the erased-data, the subsequent step will then be the step S109.

In the sixth step S106, the control unit 30 verifies whether the address data fetched from the internal address bus 15 corresponds to the final address concerned with the batch erasure. If the verified address would be the final address, the subsequent step will be the seventh step S107. If the verified address would not be the final address, the subsequent step will be the step S110.

In the seventh step S107, the control unit 30 outputs the erasure/write completion signal 34 which is then transferred into the erasure/write times counter 31 so that the erasure/write times counter 31 shows the counting operation by adding "1" to the previously counted data stored in the erasure/write times counter 31. After the addition, the erasure/write times counter 31 outputs the currently counted data onto the internal write data bus 26 on which the currently counted data is then transferred to the erasure/write times memory 32 for storing the currently counted data in the erasure/write times memory 32.

In the eighth step S108, the control unit 30 shifts the selective signal 19 into the invalid level as well as outputs the second erasure signal 24 which is transferred into the erasure/write times memory 32 for erasure of the count data stored in the erasure/write times memory 32. The control unit 30 transfers both the invalid level of the selective data 19 and the second write signal 23 into the erasure/write times memory 32. The erasure/write times memory 32 having received the inputs of both the invalid level of the selective data 19 and the second write signal 23 fetches the currently counted data from the internal write data bus 26 for storing the same therein thereby the step S108 is completed. This means that the batch erasure operations are completed.

With reference back to the step S105, if the verified data would not be the erased-data, the process will progress into the step S109. The control unit 30 verifies whether the count data fetched from the count data bus 25 is larger than a predetermined reference number. If the count data is larger than the predetermined reference number it was recognized that the electrically erasable and programmable read only memory 1 be inferior good. As a result, the process currently executing will be discontinued. If the count data is smaller than the predetermined reference number, the process will progress into the step S103. In the step S103, the control unit 30 switches the selective signal 19 into the valid level and further outputs the erasure control signal 18 for a predetermined time duration which corresponds to a time unit during which one of the high voltage erasure pulses should be applied to the memory cell in the electrically erasable and programmable read only memory 1. As a result, the first erasure/write control signal generator 3 outputs the first erasure signal 22 only for the unit of the time duration to be transferred to the electrically erasable and programmable read only memory 1 so that the electrically erasable and programmable read only memory 1 performs the erasure operation for the unit of the time duration by application of the high voltage pulse to all of the memory cells provided in the electrically erasable and programmable read only memory 1. At time, the control unit 30 supplies the erasure control signal 18 to the erasure pulse application times counter 5 so that the erasure pulse application times counter 5 performs the counting operation by adding "1" into the counted data stored therein. The erasure pulse application times counter 5 outputs the counted data onto the count data bus 25 so that the currently counted data is kept to be transferred into the control unit 30. This means that the control unit 30 is kept informed of the currently counted data as to the number of times of applications of the high voltage erasure pulse signals. The subsequent steps are the fourth and fifth steps S104 and S105.

With reference back to the step S106, if the verified address would not be the final address, the process will progress into the step 110 in which the control unit 30 performs an increment of the verify-address by adding the verify-address with one address and thereafter the control unit 30 outputs the address data having received the increment with one address onto the internal address bus 15 so that the incremented address data is transferred into the electrically erasable and programmable read only memory 1 to thereby progress into the step S105. In the step 105, the electrically erasable and programmable read only memory 1 fetches the incremented address data of the internal address bus 15 to specify a memory cell according to the incremented address data for subsequent output of data stored in the specified memory cell onto the data bus 12. The data of the specified memory cell is then transferred on the data bus 12 to the control unit 30. The control unit 30 fetches the data of the specified memory cell to verify whether the fetched data associated with the specified memory cell would be the erased-data or the data after the erasure was implemented. If the verified data would be the erased-data after the erasure operation, the subsequent step will be the step S106. If the verified data would not be the erased-data, the subsequent step will then be the step S109.

As a result of the foregoing processes, the batch erasure operation is completed. The counted total number of times of the erasure/write operations is then stored in the erasure/write times memory 32. The central processing unit 39 supplies the erasure/write times readout instruction signal 35 to the erasure/write times memory 32 thereby the erasure/write times memory 32 outputs the total number of times of the erasure/write operations stored therein onto the data bus 12 so that the data as to the total number of times of the erasure/write operations are transferred to the central processing unit 39.

The above structure of the conventional non-volatile semiconductor memory 40 has the provisions of the erasure/write times counter 31 for counting the number of times of the erasure/write operations and the erasure/write times memory 32 for storing the counted data associated with the number of times of the erasure/write operations so as to detect a deterioration, due to the repeat of a number of times of the erasure/write operations, of the property of the electrically erasable and programmable read only memory 1. The above structure is designed to allow the output of the above data of the total count number onto the data bus so as to permit the readout thereof by the central processing unit 39. Those result in a certain reduction in a burden of the central processing unit 39 in management of the number of times of the erasure/write operations associated with the electrically erasable and programmable read only memory 1.

The above non-volatile semiconductor memory 40 would be required to implement repeats a number of times of alternations of the high voltage erasure signal applications for the short unit time duration and subsequent verifying process for verifying whether there has already been erased informations or data stored in all of the memory cells in the electrically erasable and programmable read only memory 1.

Actually, however, a considerably large number of times of applications of the high voltage pulse signals for the short unit time duration are required. It may be assumed that the unit time duration is 10 milliseconds, the averaged number of times of the repeats of the alternations of the high voltage erasure signal applications processes and subsequent verifying process is 50, a time necessary for the readout operation of one word is 1 microsecond and an address area to be subjected to the batch erasure has 16 Chords wherein 1K=1024. The averaged time necessary for verifying one time the erasure states of all the memory cells is given by the following equation, namely 10 milliseconds.

$$(\tfrac{1}{2}) \times (1\ \mu s) \times (16K) = 10\ ms. \tag{1}$$

The averaged time necessary for the batch erasure operation is given by the following equation, namely about 1000 milliseconds.

$$(10\ ms + 10\ ms) \times 50 = 1000\ ms. \tag{2}$$

The time necessary for verifying the erasure states of all the memory cells occupies about 50% of the time necessary for the batch erasure operation. This may largely contribute the enlargement of the time necessary for the batch erasure operation.

On the other hands, the requirement for improvement in high speed erasure and write operations of the non-volatile semiconductor memory device has been on the increase. Under such circumstances, it has seriously been required to develop a new technique for a possible reduction of the time necessary for the batch erasure operations.

SUMMARY OF THE INVENTION

Accordingly, it is an object of the present invention to provide a novel non-volatile semiconductor memory with an electrically erasable and programmable read only memory free from any disadvantages or problem as described above.

It is a further object of the present invention to provide a novel non-volatile semiconductor memory allowing an electrically erasable and programmable read only memory to show an extremely high speed batch erasure operation.

It is a furthermore object of the present invention to provide a novel nonvolatile semiconductor memory with a feature to reduce the time necessary for the batch erasure operations of all the memory cells provided in the electrically erasable and programmable read only memory.

It is a moreover object of the present invention to provide a novel non-volatile semiconductor memory with a feature to prevent a central processing unit coupled to the memory from increasing any burden associated with the batch erasure operation of the electrically erasable and programmable read only memory.

It is a still further object of the present invention to provide a novel non-volatile semiconductor memory capable of keeping a high reliability even when a voltage of power supply for the non-volatile semiconductor memory is varied.

The above and other objects, features and advantages of the present invention will be apparent from the following descriptions.

The present invention provides a non-volatile semiconductor memory device showing a high speed batch erasure operation. The device comprises an electrically erasable and programmable read only memory including memory cells, an erasure pulse signal generator coupled to the electrically erasable and programmable read only memory for generating erasure pulse signals to be applied onto the memory cells, a control unit coupled to the erasure pulse signal generator for controlling operations of erasure pulse signal generations by supplying erasure control signals to the erasure pulse signal generator, a memory f for storing a predetermined reference number of times of erasure pulse signal applications, where the predetermined reference number is set to correspond to an estimated number of times of the erasure pulse signal applications necessary for completing the batch erasure operation, a counter coupled to the control unit for counting the number of times of erasure pulse signal applications currently made onto the memory cells by fetching the erasure control signals from the control unit, and a comparator coupled to both the memory and the counter for comparing the counted number of times of erasure pulse signal applications currently made and fetched from the counter with the predetermined reference number fetched from the memory and then outputting a correspondence signal to be supplied to the control unit only when the counted number of times of erasure pulse signal applications corresponds to the predetermined reference number, whereby the control unit implements processes comprising the following steps. Applications of the erasure pulse signals onto the memory cells are continued until the control unit receives the correspondence signal from the comparator. Thereafter, a set of an additional erasure pulse signal application onto the memory cells and a verifying process for verifying erasure states of all the memory cells is repeated until the control unit can verify the fact that all the memory cells have been in erasure states.

The estimated number stored in the memory may be set to correspond to a total number of times of erasure pulse signal applications made in the previous batch erasure operation having already been completed. The estimated number stored in the memory may be renewed to correspond to the total number of times of erasure pulse signal applications made in the previous batch erasure operation having already been completed only when the total number is changed. The estimated number stored in the memory may be kept constant during the batch erasure operation and the estimated number being set prior to commencement of the bath erasure operation.

There may be further provided a translation table coupled between the memory and the comparator for translating the predetermined reference number according to a translation table to reduce the predetermined reference number thereby the comparator fetches the reduced number from the predetermined reference number. There may be further provided a renewal feature coupled to the memory and the control unit for renewing the estimated number stored in the memory to correspond to the total number of times of erasure pulse signal applications made in the previous batch erasure operation just having been completed only when the total number is changed.

BRIEF DESCRIPTIONS OF THE DRAWINGS

Preferred embodiments of the present invention will be described in detail with reference to the accompanying drawings.

DESCRIPTIONS OF THE INVENTION

Figure 1:
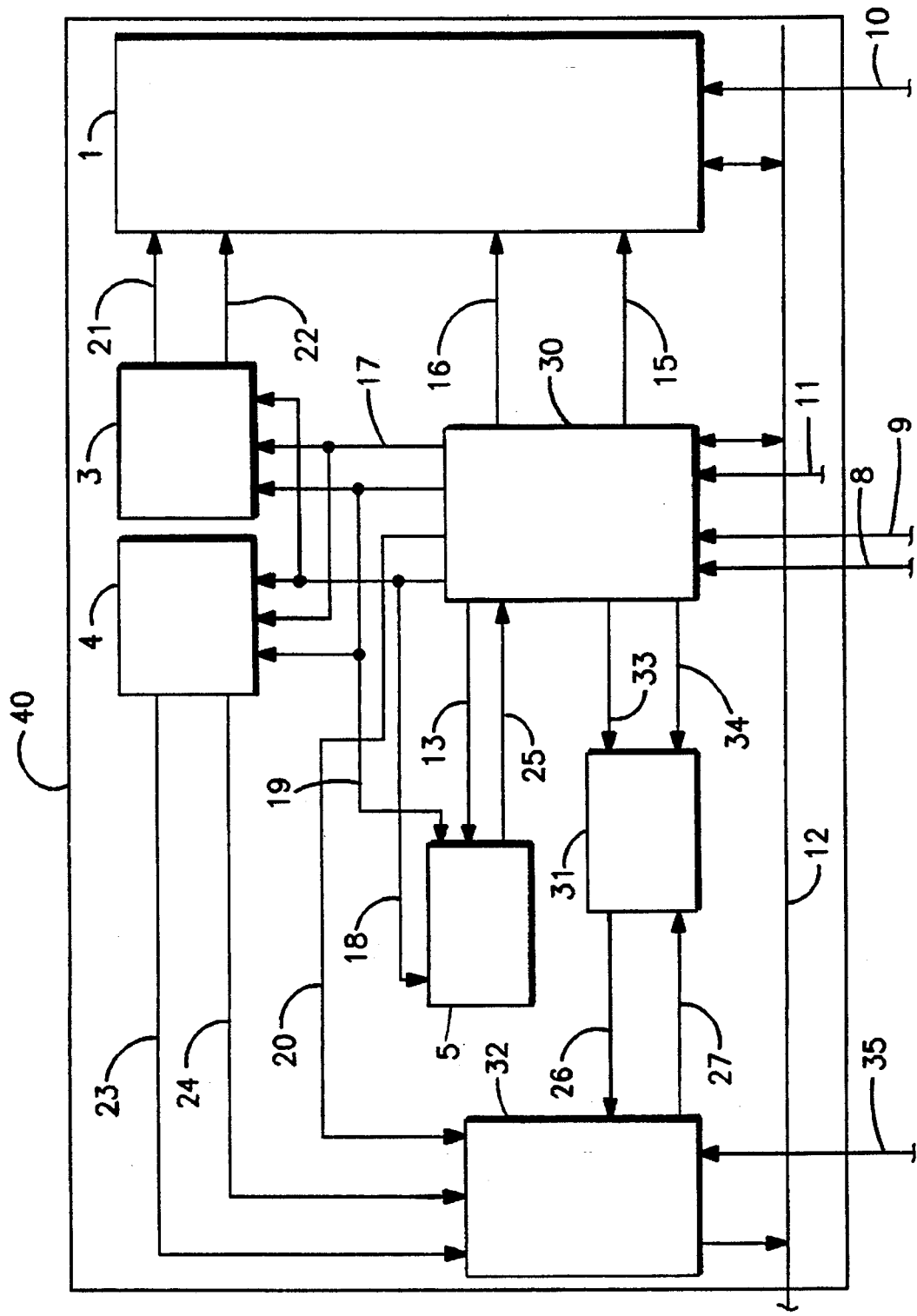
FIG. 1 is a block diagram illustrative of the structure of the conventional non-volatile semiconductor memory.

The present invention will be described in which a novel non-volatile semiconductor memory including an electrically erasable and programmable read only memory which shows an extremely high speed batch erasure operations. The batch erasure operations may be regarded to be divided into the following two steps. In a first step, a high voltage erasure signal is continuously applied to all of the memory cells provided in the electrically erasable and programmable read only memory for a time duration which corresponds to the time duration having been consumed until the completion of the previous batch erasure operations without implementation of any verifying operation for verifying the erasure states of all of the memory cells. In the beginning of the subsequent second step, the verifying operation is first implemented to verily, whether all data stored in all the memory cells have already been erased. If the all data have been erased, the batch erasure operation of the novel non-volatile semiconductor memory is completed. In this case, the time necessary for the batch erasure operation according to the present invention is reduced to a half of the time necessary for the conventional batch erasure operation described above since the novel batch erasure operation fails to implement any verifying operation of the erasure state of the memory cells while the conventional batch erasure operation comprises the repeat of alternations of the erasure signal application onto the memory cells for the predetermined short time duration and the subsequent verifying operation for verifying whether all data stored in all the memory cells have been erased until the required erasure of the all data was verified, wherein the time necessary for the verifying operation occupies about a half of the total time necessary for the completion of the entire batch erasure operations.

It however, the all data have not yet been erased, the following processes will be implemented to complete the required batch erasure of all data stored in all the memory cells. The following processes comprise repeats of alternations of an application for a predetermined short time duration of a high voltage erasure signal onto all the memory cells for completion of the batch erasure operation and a subsequent verifying operation for verifying whether any data stored in all the memory cells have been erased, until the required erasure of all data stored in all the memory cells was verified. In this case, when the first step is completed, the batch erasure operation have been near the completion since in the first step the high voltage erasure signal has been applied to the memory cells for the time which corresponds to the total time required for obtaining the completion of the previous batch erasure operation. Hence, the number of repeats of the alternations of the high voltage erasure signal applications and the subsequent verifying operations according to the present invention is extremely smaller than the number of repeats thereof in the conventional process described above. In the present invention, thus, the time consumed in the second step is sufficiently smaller than the time consumed in the first step. As described above, the time required in the first step occupies only about a half of the total time required for the completion of the conventional batch erasure operation. Whereas the total time of the first and second steps in the present invention is just longer than the total time required in the conventional batch erasure operation. This means that the time required for obtaining the completion of implementations of the batch erasure operations according to the present invention would considerably reduced near to a half of the time required in the conventional batch erasure operation. The novel bath erasure processes described above permits the electrically erasable and programmable read only memory to exhibit an extremely high speed batch erasure operation.

To realize the above novel extremely high speed batch erasure operation, the novel non-volatile semiconductor memory is required to include at least a feature for comparing a currently counted total time for which the high voltage erasure signals have been applied onto the memory cells with a reference time which corresponds to the total time consumed in the previous batch erasure operation so that the high voltage erasure signal application onto the memory cells is maintained without any intervention of the process for verifying the erasure states of all the memory cells, until the currently counted total time corresponds to the reference time.

According to the present invention, the novel non-volatile semiconductor memory includes the following elements.

Figure 4:
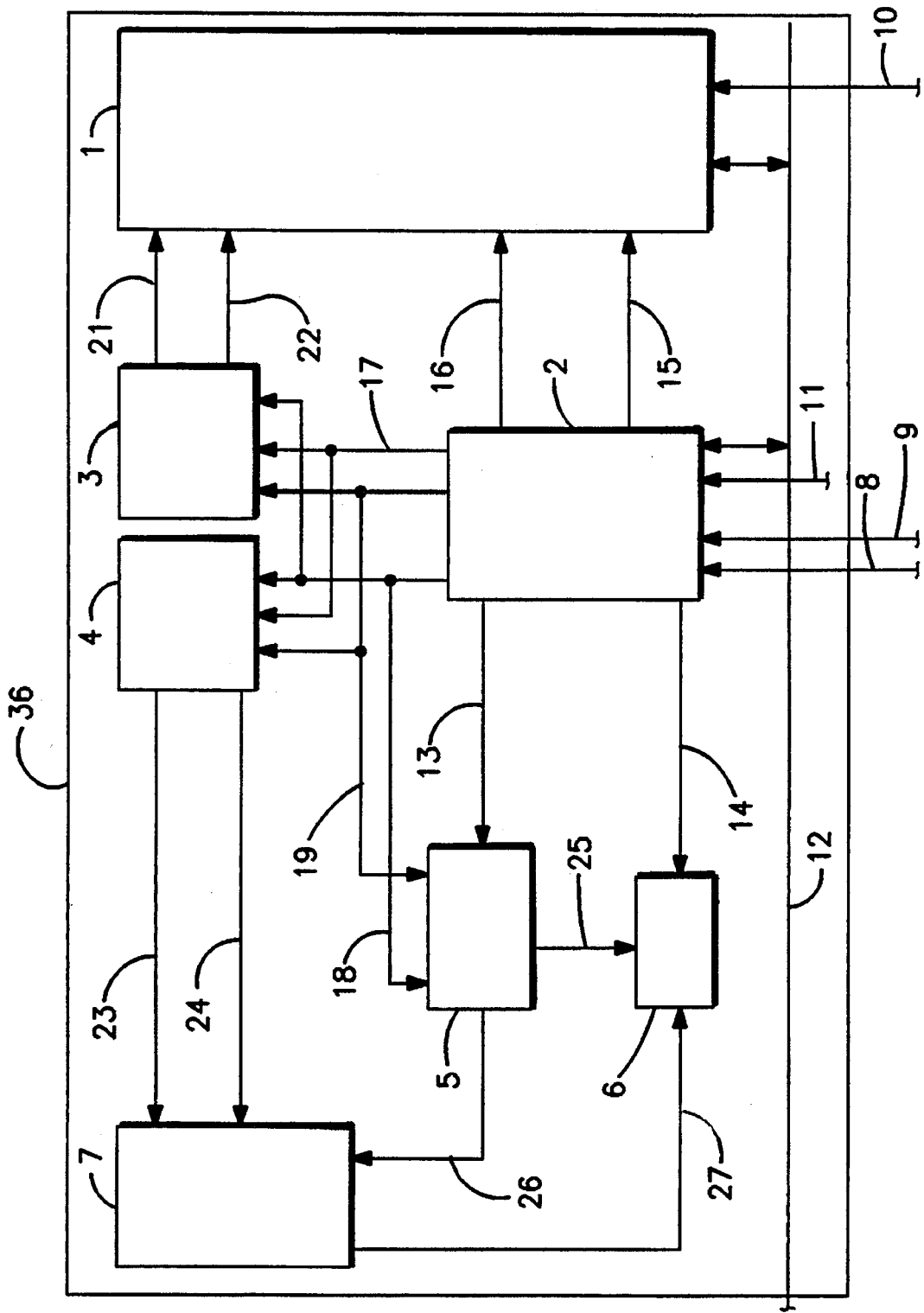
FIG. 4 is a block diagram illustrative of the structure of a novel non-volatile semiconductor memory in a first embodiment according to the present invention.

A first embodiment according to the present invention will be described. A configuration of a novel non-volatile semiconductor memory device will hereinafter be described with reference to FIG. 4.

A non-volatile semiconductor memory device 36 includes an electrically erasable and programmable read only memory 1 showing an extremely high speed batch erasure operation wherein all informations stored in all of memory cells provided in the electrically erasable and programmable read only memory 1 are erased. The non-volatile semiconductor memory device 36 further includes first and second erasing/writing signals generators 3 and 4, a control unit 2 for controlling operations of individual elements constituting the non-volatile semiconductor device 36, an erasure pulse application times-counter 5 for counting the number of times of the application of the erasure pulse signals, an erasure pulse signal application times-memory 7 for storing the counted number of times of the erasure pulse signal applications and a comparator 36 for comparing a currently counted total number of times of the erasure/pulse signal applications fetched from the erasure pulse signal application times-counter 5 with a previous total number of times of the erasure pulse signal applications having already been made in the previous batch erasure operation and fetched from the erasure pulse signal application times memory 7 so that the high voltage erasure signal application onto the memory cells is maintained under the control of the control unit 2 without any intervention of the process for verifying the erasure states of all the memory cells, until the currently counted total time corresponds to the reference time.

Figure 2:
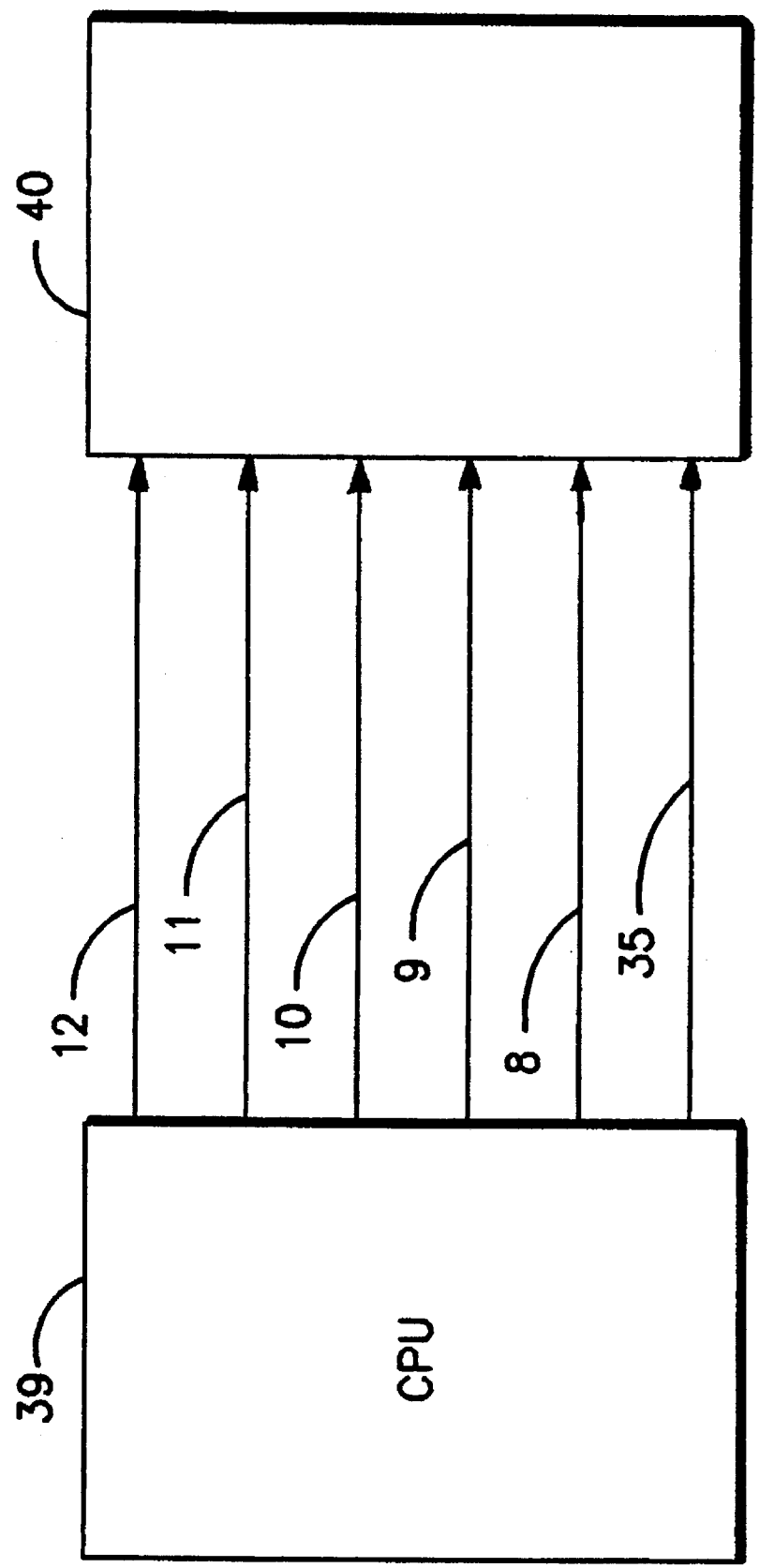
FIG. 2 is a block diagram illustrative of connections between the central processing unit and the non-volatile semiconductor memory.
Figure 3:
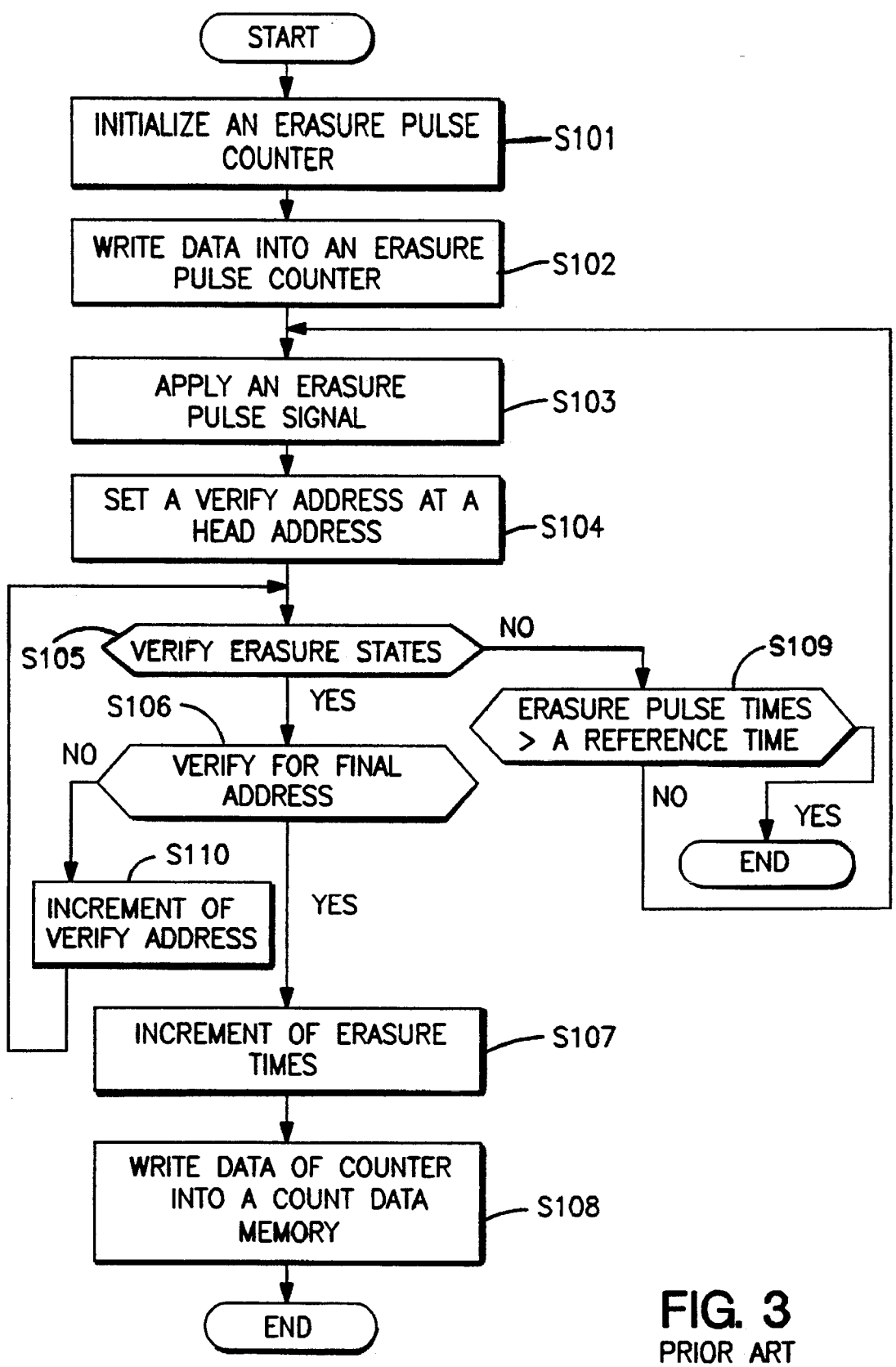
FIG. 3 is a flow chart illustrative of the processes for batch erasure operations of the conventional non-volatile semiconductor memory.

The electrically erasable and programmable read only memory 1 is coupled to a data bus 12 so that informations stored in a specified one in the memory cells comes into a readout to output onto the data bus 12 which is further coupled to a central processing unit 39 illustrated in FIG. 2. The electrically erasable and programmable read only memory 1 is also coupled to the central processing unit 39 to receive a readout instruction signal 10. The electrically erasable and programmable read only memory 1 is also coupled to the control unit 2 to receive a first readout signal 16 and address informations transferred on an internal address bus 15. When the electrically erasable and programmable read only memory 1 receives any one of the readout instruction signal 10 and the first readout signal 16, the electrically erasable and programmable read only memory 1 performs a readout, onto the data bus 12, of an information stored in a memory cell specified according to the address data that the electrically erasable and programmable read only memory 1 received via the internal data bus 15. The electrically erasable and programmable read only memory 1 is also coupled to the first erasing/writing signals generator 3 to receive a first writing signal 21 and a first erasing signal 22. When the electrically erasable and programmable read only memory 1 receives the first writing signal 21, the electrically erasable and programmable read only memory 1 fetches informations on the data bus 12 and stores the fetched informations into a memory cell specified according to the address data that the electrically erasable and programmable read only memory 1 received via the internal data bus 15. When the electrically erasable and programmable read only memory 1 receives the first erasing signal 21, the electrically erasable and programmable read only memory 1 implements the batch erasing operation to erase all informations stored in all the memory cells regardless of the address informations that the electrically erasable and programmable read only memory 1 received via the internal data bus 15.

The control unit 2 is coupled to the central processing unit 39 to receive a writing instruction signal 8 and an erasing instruction signal 9. The control unit 2 is coupled to the central processing unit 39 via an external address bus 11 on which address informations are transferred between the control unit 2 and the central processing unit 39. The control unit 2 is also coupled to the data bus 12 to output the data onto the data bus 12 and fetch the data from the data bus 12. The control unit 2 is coupled to the erasure pulse signal application times counter 5 to supply an initialization signal 13 to the erasure pulse signal application times counter 5 as well as to supply an erasure control signal 18 and a selective signal 19 to the erasure pulse signal application times-counter 5. The selective signals 19 comprise binary digit signals having valid and invalid levels. When the control unit 2 receives no input of the erasing instruction signal 9, the control unit 2 renders address data of the external address data bus 11 directly output onto the internal address bus 15 on which the address data are transferred into the electrically erasable and programmable read only memory 1. The control unit 2 is further coupled to the first erasing/writing signals generator 3 to supply a writing control signal 17, the erasure control signal 18 and the selective signal 19 into the first erasing/writing signals generator 3. The control unit 2 is furthermore coupled to the second erasing/writing signals generator 4 to supply the writing control signal 17, the erasure control signal 18 and the selective signal 19 into the second erasing/writing signals generator 4. When the control unit 2 receives the input of the write instruction signal 8, the control unit 2 renders the selective signal come into the valid level and further supply the write control signal to the first erasing/writing signals generator 3 for a time corresponding to the predetermined time during which one of the erasing pulse signals is applied to the memory cells in the electrically erasable and programmable read only memory 1. When the control unit 2 receives the input of the erasing instruction signal 9, the control unit 2 shows, with reference to erasure pulse application times data on the count data bus 25, outputs of the address informations onto the internal address bus 15.

The erasure pulse signal application times memory 7 is coupled to the second erasure/write signals generator 4 to receive both a second write signal 23 and a second erasure signal 24 from the second erasure/write signals generator 4. The erasure pulse signal application times memory 7 is further coupled to the erasure pulse signal application times counter 5 to receive an input data concerned with the counted number of times of applications of the erasure pulse signals supplied via an internal data bus 26 from the erasure pulse signal application times counter 5 for storing the counted number of times of applications of the erasure pulse signals.

The first erasure/write signals generator 3 shows an output of the first write signal 21 only in a time duration when the selective signal 19 is kept in the valid level and the first erasure/write signals generator 3 is kept to receive an input of the write control signal 17. The first erasure/write signals generator 3 also shows an output of the first erasure signal 22 only in a time duration when the selective signal 19 is kept in the valid level and the first erasure/write signals generator 3 is kept to receive an input of the erasure control signal 18.

The second erasure/write signals generator 4 shows an output of the second write signal 23 only in a time duration when the selective signal 19 is kept in the invalid level and the second erasure/write signals generator 4 is kept to receive an input of the write control signal 17. The second erasure/write signals generator 4 also shows an output of the second erasure signal 24 only in a time duration when the selective signal 19 is kept in the invalid level and the second erasure/write signals generator 4 is kept to receive an input of the erasure control signal 18.

The erasing pulse application times-counter 5 initializes the counting data stored therein when receiving the initialization signal 13. The erasing pulse application times counter 5 adds "1" into the existent count data only when the selective signal 19 is kept in the invalid level and the erasure pulse application times counter 5 receives the input of the erasure control signal 18 from the control unit 2. The erasure pulse application times counter 5 keeps to output the data as to the counted number of times of applications of the erasure pulse signals onto the count data bus 25 for keeping the comparator informed of the count data.

The erasure pulse signal application times memory 7 keeps to output the data of the final or total counted number of times of the erasure pulse signal applications stored therein onto the internal readout data bus 27. The erasure pulse signal application times memory 7 stores the currently counted data fetched via the internal write data bus 26 from the erasure pulse signal application times counter 5 only when receiving the input of the second write signal 23. The erasure pulse signal application times memory 7 shows an erasure operation of the data stored therein when receiving the input of the second erasure signal 24.

The comparator 6 is coupled to the erasure pulse signal application times counter 5 to receive the input of the data concerned with the currently counted number of times of the erasure pulse signal applications supplied from the erasure pulse signal application times counter 5 via the counter data bus 25 so that the comparator 6 is kept informed of the currently counted number of times of the erasure pulse signal applications. The comparator 6 is also coupled to the erasure pulse signal application times memory 7 via the internal readout data bus 27 to receive the input the data concerned with the total number of times of all of the erasure pulse signal applications made in the previous batch erasure operations supplied via the internal readout data bus 27 from the erasure pulse signal application times memory 7. As a result, the comparator 6 can compare the currently counted number of times of the erasure pulse signal applications supplied from the erasure pulse signal application times counter 5 with the total number of times of all of the erasure pulse signal applications made in the previous batch erasure operations from the erasure pulse signal application times memory 7. The comparator 6 is also coupled to the control unit 2 to supply a correspondence signal 14 which comes into an active level only when it is confirmed by the comparison operation that the currently counted number of times of the erasure pulse signal applications corresponds to the total number of times of all of the erasure pulse signal applications made in the previous batch erasure operations.

Figure 5:
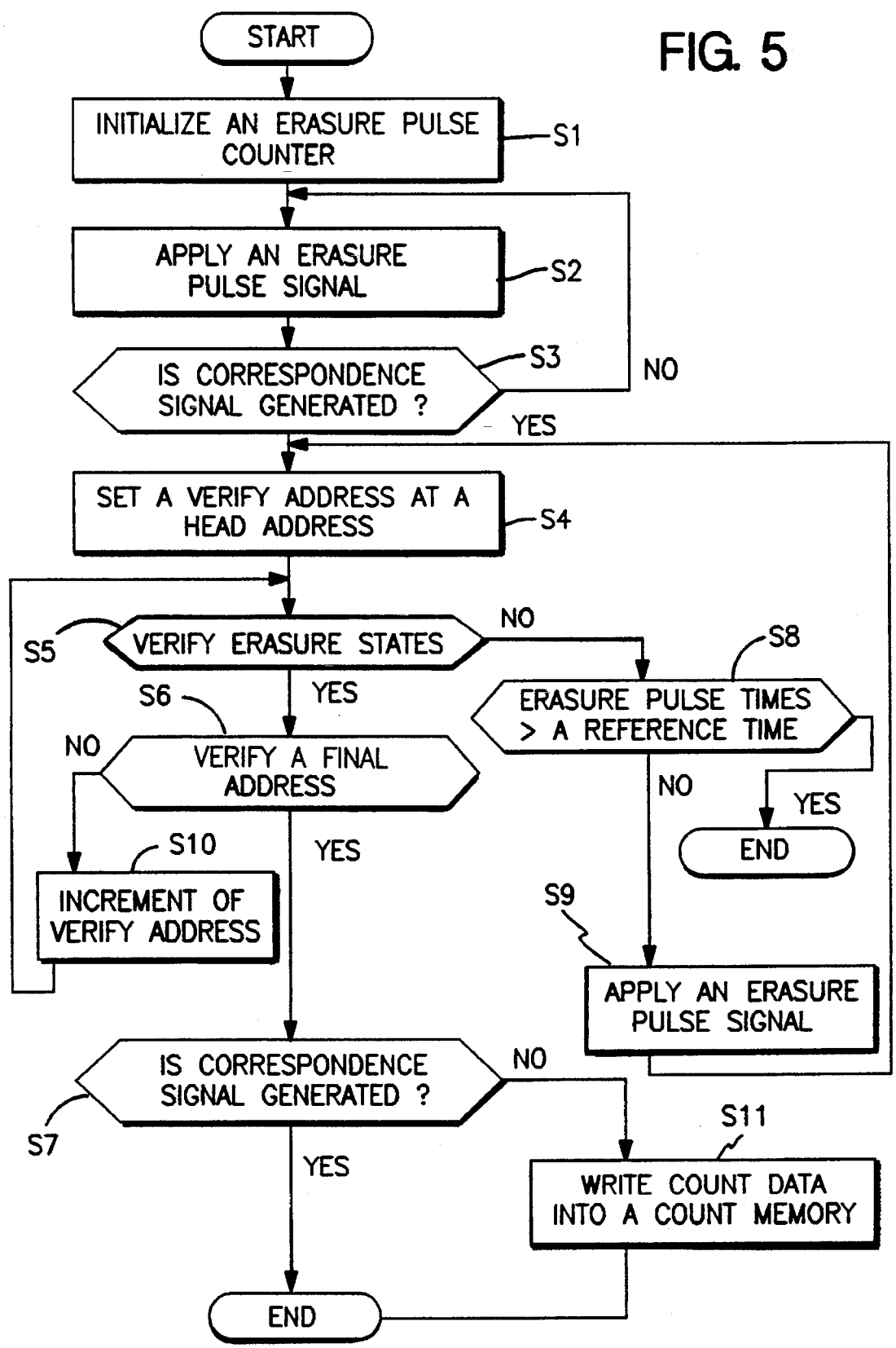
FIG. 5 is a flow chart illustrative of the processes for batch erasure operations of a novel non-volatile semiconductor memory in a first embodiment according to the present invention.

The following descriptions will focus on the batch erasure operation of the novel non-volatile semiconductor memory device with reference to FIG. 5 which is illustrative of the steps involved in the batch erasure operations in the form of the flow chart. The batch erasure operation starts and then subsequent operations are implemented.

In a first step S1, the control unit 2 outputs the initialization signal 13 which is then transferred to the erasure pulse signal application numbers counter 5 thereby the erasure pulse signal application numbers counter 5 initialize the count data stored therein into "0".

In the second step S2, the control unit 2 set the selective signal 19 into the valid level and further outputs the erasure control signal 18 for a predetermined short time duration. The erasure/write signal generator 3 receives the inputs of the selective signal 19 in the valid level and the erasure control signal 17 and then outputs the first erasure signal 22 For the predetermined short time duration which is transmitted into the electrically erasable and programmable read only memory 1 thereby the first erasure signal 22 is applied for the predetermined short time duration to all of the memory cells provided in the electrically erasable and programmable read only memory 1, resulting in the temporally batch erasure operation of the electrically erasable and programmable read only memory 1 for the predetermined short time duration. The erasure control signal 18 is also transferred from the control unit 2 into the second erasure/write signal generator 4 thereby the second erasure/write signal generator 4 receives inputs of the selective signal in the valid level and the erasure control signal 18 for the predetermined short time duration and then outputs none of the second erasure signal 24 due to the valid level of the selective signal 19. The erasure pulse signal application times counter 5 receives inputs of the erasure control signal 18 and the selective signal 19 in the valid level and then add "1" into the previous counted data already stored therein to output the currently counted data onto the count data bus 25 which is connected to the comparator 6. The erasure pulse signal application times counter 5 also outputs the currently counted data onto the internal write data bus 26 which is connected to the erasure pulse signal application times memory 7.

In the third step S3, the erasure pulse signal application times memory 7 stores therein the total count data stored therein as the total number of times of applications of the erasure pulse signals needed for the completion of the previous batch erasure operation. The erasure pulse signal application times memory 7 outputs the total number of times of the erasure pulse signal applications made until the completion of the previous batch erasure operations for all the memory cells in the electrically erasable and programmable read only memory 1 onto the internal read out data bus 27 which is connected to the comparator 6. The comparator 6 fetches the previous total count data via the internal read out data bus 27 and the currently counted data via the count data bus 25 and then compares the currently counted data of the currently counted number of times of the erasure pulse signal applications made in the present batch erasure operation with the counted previous total number of times of the erasure pulse signal applications made during the previous batch erasure operation. If the comparator 6 verified no correspondence between the currently counted number of times of the erasure pulse signal applications made in the present batch erasure operation and the counted previous total number of times of the erasure pulse signal applications made during the previous batch erasure operation, then the comparator 6 outputs none of the correspondence signal 14 and the process will back to the step S2 so that there is again made the application of the erasure pulse signal for the predetermined short time duration onto all of the memory cells provided in the electrically erasable and programmable read only memory 1 as well as the erasure pulse signal application times counter 5 performs the counting operation to add "1" into the count data. The currently counted data is then compared with the previous total count data by the comparator 6 in the third step S3.

The above steps S2 and S3 will be repeated alternatively until the comparator 6 can verify the correspondence between the currently counted number of times of the erasure pulse signal applications made in the present batch erasure operation. Those means that the erasure pulse signal applications are continuously repeated without implementation of verification of erasable states of all the memory cells provided in the electrically erasable and programmable read only memory 1 until the count number of times of the erasure pulse signal applications corresponds to the previous total number of times of the erasure pulse signal applications made in the previous batch erasure operations.

If the comparator 6 can verify, the correspondence between the currently counted number of times of the erasure pulse signal applications made in the present batch erasure operation and the previous total number of times of the erasure pulse signal applications made in the previous batch erasure operation, the comparator 6 outputs the correspondence signal 14 or renders the correspondence signal 14 active which is then transferred into the control unit 2. In this case, the process will progress into the following step in which the control unit 2 verifies the erasure states of the memory cells.

In the fourth step S4, the control unit 2 receives an input of the correspondence signal in the active state and then outputs a head address as a verify address concerned with the batch erasure onto the internal address bus 15 on which the head address is transferred into the electrically erasable and programmable read only memory 1 as well as outputs the first read out signal 16 which is also transferred to the electrically erasable and programmable read only memory 1.

In the filth step S5, the electrically erasable and programmable read only memory 1 fetches the head address data of the internal address bus 15 to specify a memory cell according to the fetched head address data for subsequent output of data stored in the specified memory cell onto the data bus 12. The data of the specified memory cell is then transferred via the data bus 12 to the control unit 2. The control unit 2 fetches the data of the specified memory cell to verify whether the fetched data associated with the specified memory cell would be the erased-data namely the data alter the erasure was implemented. If the verified data would be the erased-data after the erasure operation, the subsequent step will be the step S6. If the verified data would not be the erased-data, the subsequent step will then be the step S8.

In the sixth step S6, the control unit 2 verifies whether the address data fetched from the internal address bus 15 corresponds to the final address concerned with the batch erasure. If the verified address would be the final address, the subsequent step will be the seventh step S7. If the verified address would not be the final address, the subsequent step will be the step S10.

In the seventh step S7, the control unit 2 verifies whether the correspondence signal 14 is still kept in the active state to verify whether any further erasure pulse signal is applied onto the memory cells in the electrically erasable and programmable read only memory 1 in addition to the above continuous applications of the erasure pulse signals in the above third step S3 where the applications are made the same times as those made in the previous batch erasure operations. If the control unit 2 can verify that the correspondence signal 14 is still kept active, this means that no further erasure pulse signal is applied after the above continuous applications of the erasure pulse signals in the above third step S3, namely means that the currently counted number of times of the erasure pulse signal applications made in the step S3 corresponds to the total number of times of the erasure pulse signal applications made in the previous batch erasure operation. In this case, it is not necessary to renew the data, stored in the erasure pulse signal application times memory 7, concerned with the total number of times of the erasure pulse signal applications made in the present batch erasure operation. The present batch erasure processes are completed.

If the control unit can verify that the correspondence signal 14 comes inactive, namely receives none of the correspondence signal 14, the following step will be step S11.

The descriptions will back to the firth step S5, wherein if the verified data would not be the erased-data, the subsequent step will then be the step S8.

In the step S8, the control unit S2 compares the fetched data concerned with the currently counted number of times of the erasure pulse signal applications with a predetermined reference number which means the maximum number of times allowing applications of the erasure pulse signals. If the applications of the erasure pulse signals are made beyond the predetermined reference number, the memory cells might be no longer available or operational. If the control unit 2 can verify that the applications of the erasure pulse signals are made beyond the predetermined reference number, the control unit 2 recognizes that the memory cells have been no longer available or operational and thus the processes will be discontinued. If the control unit 2 can verify that the applications of the erasure pulse signals are made below the predetermined reference number, the subsequent step will be the step S9.

In the step S9, the control unit 2 renders the selective signal 19 come active level as well as outputs only one-time the erasure control signal 18 for the predetermined short time duration. The first erasure/write signals generator 3 receives the one-time input of the erasure control signal 18 and then outputs the first erasure pulse signal 22 which is applied onto the memory cells in the electrically erasable and programmable read only memory 1 so that a first time additional batch erasure operation is made after the step S3 in which the continuous applications of the erasure pulse signals were made the same times as those made in the previous batch erasure operation being completed. At the same time, the erasure pulse signal application times counter 5 receives both the erasure control signal 18 for the predetermined short time duration and the selective signal 19 in the active state and then implements the counting operation by adding "1" to the counted data stored therein concerned with the currently counting number of times of the erasure pulse signal applications. The erasure pulse signal application times counter 5 outputs the currently counted data onto the count data bus 25 on which the currently counted data is transferred into the comparator 6. The process will progress to the step S4.

Referring back to the step S4, the control unit 2 again outputs the head address as a verify address concerned with the batch erasure onto the internal address bus 15 on which the head address is transferred into the electrically erasable and programmable read only memory 1 as well as outputs the first read out signal 16 which is also transferred to the electrically erasable and programmable read only memory 1.

Referring back to the step S5, the electrically erasable and programmable read only memory 1 fetches the head address data of the internal address bus 15 to specify a memory cell according to the fetched head address data for subsequent output of data stored in the specified memory cell onto the data bus 12. The data of the specified memory cell is then transferred via the data bus 12 to the control unit 2. The control unit 2 fetches the data of the specified memory cell to verify, whether the fetched data associated with the specified memory cell would be the erased-data namely the data after the erasure was implemented. If the verified data would be the erased-data after the erasure operation, the subsequent step will be the step S6. If the verified data would not be the erased-data, the subsequent step will then be the step S8.

Referring back to the step S6, the control unit 2 verifies whether the address data on the internal address data bus 15 be the final address. If the address data on the internal address data bus 15 is the final address, then the process will progress to the step S7 as described above. The however, address data on the internal address data bus 15 is not the final address, then the process will progress to the step S10.

In the step S10, the control unit 2 implements an increment associated with the verify address data by adding 1"-address" to the verify address data and then outputs the incremented address data onto the internal address bus 15 for subsequent return to the step S5 in which the electrically erasable and programmable read only memory 1 fetches the incremented address data of the internal address bus 15 to specify, a memory cell according to the incremented address data for subsequent output of data stored in the specified memory cell onto the data bus 12. The data of the specified memory cell is then transferred via the data bus 12 to the control unit 2. The control unit 2 fetches the data of the specified memory cell to verify whether the fetched data associated with the specified memory cell would be the erased-data namely the data after the erasure was implemented. If the verified data would be the erased-data after the erasure operation, the subsequent step will be the step S6.

If the verified address would be the final address, the subsequent step will be the seventh step S7. If the verified address would not be the final address, the subsequent step will be the step S10.

In the seventh step S7, if the control unit 2 can verify that the correspondence signal 14 is still kept inactive, this means that one or a plurality of further erasure pulse signals are applied after the above continuous applications of the erasure pulse signals in the above third step S3, namely means that the currently counted number of times of the erasure pulse signal applications made in the step S3 is above the total number of times of the erasure pulse signal applications made in the previous batch erasure operation. In this case, it is necessary to renew in the following step S11 the data stored in the erasure pulse signal application times memory 7, concerned with the total number of times of the erasure pulse signal applications made in the present batch erasure operation.

In the step S11, the erasure pulse signal application times memory 7 receives the data associated with the currently counted number of times of the erasure pulse signal applications made during the present batch erasure operation and then stores the data therein thereby the data stored in the erasure pulse signal application times memory 7 is renewed, alter which the processes for the batch erasure operation will be terminated.

According to the above descriptions of the novel non-volatile semiconductor memory with an electrically erasable and programmable read only memory, the applications of the erasure pulse signals, each of which is made for the predetermined short time duration, are continuously made, the same times or for the same time period as those made in the previous batch erasure operation having been completed, without implementation of verification operation for verifying the erasure states of all the memory cells in the electrically erasable and programmable read only memory 1. If it can be verified that all data stored in all the memory cells provided in the electrical erasable and programmable read only memory 1 are erased, then the batch erasure operation is completed. In this case no intermediate verifying process is made. As a result, the times consumed for the completion of the batch erasure operation in the above first embodiment is only about a hall of the times necessary in the conventional batch erasure operation as described above.

If it can not be verified that all data stored in all the memory cells provided in the electrical erasable and programmable read only memory 1 are erased, then the application of the erasure pulse signal and subsequent verifying process for verifying the erasure states of all the memory cells in the electrically erasable and programmable read only memory are alternatively repeated until it can be verified that all data stored in all the memory, cells provided in the electrical erasable and programmable read only memory 1 are erased. As a result, the number of times of the verifying process for verifying the erasure states of all the memory cells in the electrically erasable and programmable read only memory is considerable reduced relative to the conventional process.

When the power voltage is constant, the application time period in which the erasure signals are applied onto the memory cells, shows a simple increase as the number of times of the erasure pulse signal applications made are increased. This ensures that the continuous applications of the erasure pulse signals the same times or the same time period as those made in the previous batch erasure operation may render the memory cells in the electrically erasable and programmable read only memory free from any excess erasure state causing no availability, of the memory cells. This means that the reliability of the electrically erasable and programmable read only memory is kept, although the times needed for the completion of the batch erasure operation is considerably reduced relative to the conventional process.

There was confirmed the fact that the time necessary for implementation of the additional erasure pulse signal applications in the step S9 after the continuous erasure pulse signal applications of the same times as those made in the previous batch erasure operation would correspond almost to the predetermined short time duration, for example, 10 milliseconds in which the erasure pulse signal application can be made one time. This means that the additional erasure pulse signal applications in the step S9 would be one time in the average, whereas the number of times of the continuous erasure pulse signal applications made in the step S3 is fifty times in the average.

Figure 6:
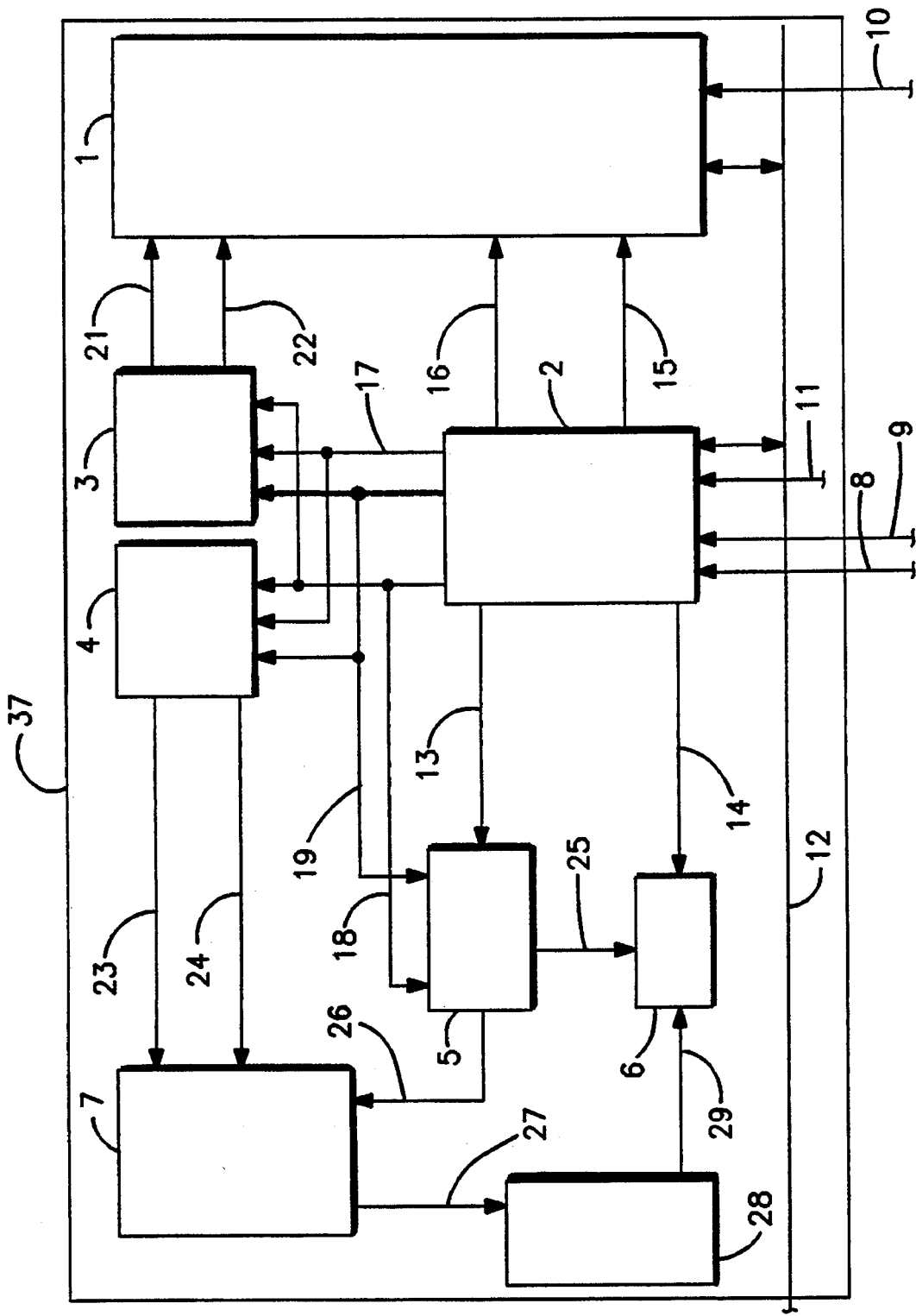
FIG. 6 is a block diagram illustrative of the structure of a novel non-volatile semiconductor memory in a second embodiment according to the present invention.

A second embodiment according to the present invention will be described. A configuration of a novel non-volatile semiconductor memory device will hereinafter be described with reference to FIG. 6 from which it can be seen that a difference in the configuration of a novel non-volatile semiconductor memory device of the second embodiment from that of the first embodiment would be only further provisions of a translation table and a translation table data bus between a comparator and an erasure pulse signal application times memory.

A non-volatile semiconductor memory device 37 includes an electrically erasable and programmable read only memory. 1 showing an extremely high speed batch erasure operation wherein all informations stored in all of memory cells provided in the electrically erasable and programmable read only memory 1 are erased. The non-volatile semiconductor memory device 37 further includes first and second erasing/writing signals generators 3 and 4, a control unit 2 for controlling operations of individual elements constituting the non-volatile semiconductor device 36, an erasure pulse application times-counter 5 for counting the number of times of the application of the erasure pulse signals, an erasure pulse signal application times-memory 7 for storing the counted number of times of the erasure pulse signal applications and a comparator 37 for comparing a currently counted total number of times of the erasure/pulse signal applications fetched film the erasure pulse signal application times-counter 5 with a previous total number of times of the erasure pulse signal applications having already been made in the previous batch erasure operation and fetched from the erasure pulse signal application times memory 7 so that the high voltage erasure signal application onto the memory cells is maintained under the control of the control unit 2 without any intervention of the process for verifying the erasure states of all the memory cells until the currently counted total time corresponds to the reference time. Further provision are made for a translation table 28 for implementation of a translation of the previous data concerned with the total counted number of times according to a translation table provided therein and a translation table data bus 29 for transferring the translated data from the translation table 28 to the comparator 6.

The electrically erasable and programmable read only memory 1 is coupled to a data bus 12 so that informations stored in a specified one in the memory cells comes into a readout to output onto the data bus 12 which is further coupled to a central processing unit 39 illustrated in FIG. 2. The electrically erasable and programmable read only memory 1 is also coupled to the central processing unit 39 to receive a readout instruction signal 10. The electrically erasable and programmable read only memory 1 is also coupled to the control unit 2 to receive a first readout signal 16 and address informations transferred on an internal address bus 15. When the electrically erasable and programmable read only memory 1 receives any one of the readout instruction signal 10 and the first readout signal 16, the electrically erasable and programmable read only memory 1 performs a readout, onto the data bus 12, of an information stored in a memory cell specified according to the address data that the electrically erasable and programmable read only memory 1 received via the internal data bus 15. The electrically erasable and programmable read only memory 1 is also coupled to the first erasing/writing signals generator 3 to receive a first writing signal 21 and a first erasing signal 22. When the electrically erasable and programmable read only memory 1 receives the first writing signal 21, the electrically erasable and programmable read onto memory 1 fetches informations on the data bus 12 and stores the fetched informations into a memory cell specified according to the address data that the electrically erasable and programmable read only memory 1 received via the internal data bus 15. When the electrically erasable and programmable read only memory 1 receives the first erasing signal 21, the electrically erasable and programmable read only memory 1 implements the batch erasing operation to erase all informations stored in all the memory cells regardless of the address informations that the electrically erasable and programmable read only memory 1 received via the internal data bus 15.

The control unit 2 is coupled to the central processing unit 39 to receive a writing instruction signal 8 and an erasing instruction signal 9. The control unit 2 is coupled to the central processing unit 39 via an external address bus 11 on which address informations are transferred between the control unit 2 and the central processing unit 39. The control unit 2 is also coupled to the data bus 12 to output the data onto the data bus 12 and fetch the data from the data bus 12. The control unit 2 is coupled to the erasure pulse signal application times counter 5 to supply an initialization signal 13 to the erasure pulse signal application times counter 5 as well as to supply an erasure control signal 18 and a selective signal 19 to the erasure pulse signal application times-counter 5. The selective signals 19 comprise binary digit signals having valid and invalid levels. When the control unit 2 receives no input of the erasing instruction signal 9, the control unit 2 renders address data of the external address data bus 11 directly output onto the internal address bus 15 on which the address data are transferred into the electrically erasable and programmable read only memory 1. The control unit 2 is further coupled to the first erasing/writing signals generator 3 to supply a writing control signal 17, the erasure control signal 18 and the selective signal 19 into the first erasing/writing signals generator 3. The control unit 2 is furthermore coupled to the second erasing/writing signals generator 4 to supply the writing control signal 17, the erasure control signal 18 and the selective signal 19 into the second erasing/writing signals generator 4. When the control unit 2 receives the input of the write instruction signal 8, the control unit 2 renders the selective signal come into the valid level and further supply the write control signal to the first erasing/writing signals generator 3 for a time corresponding to the predetermined time during which one of the erasing pulse signals is applied to the memory cells in the electrically erasable and programmable read only memory 1. When the control unit 2 receives the input of the erasing instruction signal 9, the control unit 2 shows, with reference to erasure pulse application times data on the count data bus 25, outputs of the address informations onto the internal address bus 15.

The erasure pulse signal application times memory 7 is coupled to the second erasure/write signals generator 4 to receive both a second write signal 23 and a second erasure signal 24 from the second erasure/write signals generator 4. The erasure pulse signal application times memory 7 is further coupled to the erasure pulse signal application times counter 5 to receive an input data concerned with the counted number of times of applications of the erasure pulse signals supplied via an internal data bus 26 from the erasure pulse signal application times counter 5 for storing the counted number of times of applications of the erasure pulse signals.

The first erasure/write signals generator 3 shows an output of the first write signal 21 only in a time duration when the selective signal 19 is kept in the valid level and the first erasure/write signals generator 3 is kept to receive an input of the write control signal 17. The first erasure/write signals generator 3 also shows an output of the first erasure signal 22 only in a time duration when the selective signal 19 is kept in the valid level and the first erasure/write signals generator 3 is kept to receive an input of the erasure control signal 18.

The second erasure/write signals generator 4 shows an output of the second write signal 23 only in a time duration when the selective signal 19 is kept in the invalid level and the second erasure/write signals generator 4 is kept to receive an input of the write control signal 17. The second erasure/write signals generator 4 also shows an output of the second erasure signal 24 only in a time duration when the selective signal 19 is kept in the invalid level and the second erasure/write signals generator 4 is kept to receive an input of the erasure control signal 18.

The erasing pulse application times-counter 5 initializes the counting data stored therein when receiving the initialization signal 13. The erasing pulse application times counter 5 adds "1" into the existent count data only when the selective signal 19 is kept in the invalid level and the erasure pulse application times counter 5 receives the input of the erasure control signal 18 from the control unit 2. The erasure pulse application times counter 5 keeps to output the data as to the counted number of times of applications of the erasure pulse signals onto the count at a bus 25 tier keeping the comparator informed of the count data.

The erasure pulse signal application times memory 7 keeps to output the data if the final or total counted number of times of the erasure pulse signal applications stored therein onto the internal readout data bus 27. The erasure pulse signal application times memory 7 stores the currently counted data fetched via the internal write data bus 26 from the erasure pulse signal application times counter 5 only when receiving the input of the second write signal 23. The erasure pulse signal application times memory 7 shows an erasure operation of the data stored therein when receiving the input of the second erasure signal 24.

The translation table 28 is coupled to the erasure pulse signal application times memory 7 via an internal readout data bus 27 for receiving the input of the previous data concerned with the total number of times of the erasure pulse signal applications having made in the previous erasure operation and subsequent translation of the received previous data according to the translation table thereof. A preferable translation rule of the translation table 28 is to raise the previous data N on the internal read out data bus 27 to the 0.9th power. Generally, the erasure properties of the electrically erasable and programmable read only memory 1 has a relationship to the power voltage, represented by an exponential function. If any variation of the power voltage appears accidentally during the continuous erasure pulse signal applications are made the same times as those made in the previous batch erasure operation, the reduction made by the translation table 28 of the previous total number of times of the erasure pulse signal applications may render the memory cells free from any possibilities of excess erasure operation. Even if the power voltage is increased by 10% accidentally during the continuous erasure pulse signal applications are made the same times as those made in the previous batch erasure operation, this may ensure that the memory cells be completely free from any possibilities of excess erasure operation. The translation table 28 outputs the translated data onto the translation table data bus 29 which is connected to the comparator 6.

The comparator 6 is coupled to the erasure pulse signal application times counter 5 to receive the input of the data concerned with the currently counted number of times of the erasure pulse signal applications supplied from the erasure pulse signal application times counter 5 via the counter data bus 25 so that the comparator 6 is kept informed of the currently counted number of times of the erasure pulse signal applications. The comparator 6 is also coupled to the translation table 28 via the translation table data bus 29 to receive the input the translated data concerned with the reduced number from the total number of times of all of the erasure pulse signal applications made in the previous batch erasure operations supplied via the internal readout data bus 27 from the erasure pulse signal application times memory 7. As a result, the comparator 6 can compare the currently counted number of times of the erasure pulse signal applications supplied from the erasure pulse signal application times counter 5 with the reduced number from the total number of times of all of the erasure pulse signal applications made in the previous batch erasure operations. The comparator 6 is also coupled to the control unit 2 to supply a correspondence signal 14 which comes into an active level only when it is confirmed by the comparison operation that the currently counted number of times of the erasure pulse signal applications corresponds to the total number of times of all of the erasure pulse signal applications made in the previous batch erasure operations.

The batch erasure operation of the second embodiment is the same as the first embodiment batch erasure operation of the novel non-volatile semiconductor memory device illustrated in FIG. 5 except for the step S3.

In the third step S3, the erasure pulse signal application times memory 7 outputs the total number of times of the erasure pulse signal applications made until the completion of the previous batch erasure operations for all the memory cells in the electrically erasable and programmable read only memory 1 onto the internal read out data bus 27 which is connected to the translation table 28. The translation table 28 receives the input of the total number of times of the erasure pulse signal applications made until the completion of the previous batch erasure operations all the memory cells for translation thereof according to the translation table to reduce the total number of times of the erasure pulse signal applications, for example, by raising the same to the 0.9th power. The translation table 28 outputs the reduced total number onto the translation table data bus 29 on which the reduced total number is transferred to the comparator 6. The comparator 6 fetches both the reduced number from the previous total count data via the translation table data bus 29 and the currently counted data via the count data bus 25 and then compares the currently counted data of the currently counted number of times of the erasure pulse signal applications made in the present batch erasure operation with the reduced number from the counted previous total number of times of the erasure pulse signal applications made during the previous batch erasure operation. If the comparator 6 verified no correspondence between the currently counted number of times of the erasure pulse signal applications made in the present batch erasure operation and the reduced number from the counted previous total number of times of the erasure pulse signal applications made during the previous batch erasure operation, then the comparator 6 outputs none of the correspondence signal 14 and the process will back to the step S2 so that there is again made the application of the erasure pulse signal for the predetermined short time duration onto all of the memory cells provided in the electrically erasable and programmable read only memory 1 as well as the erasure pulse signal application times counter 5 performs the counting operation to add "1" into the count dam. The currently counted data is then compared with the reduced number from the previous total count data by the comparator 6 in the third step S3.

As described above, all the remaining processes are the same as those of the first embodiment, accordingly, the descriptions of the remaining processes of the second embodiment will be omitted.

Figure 7:
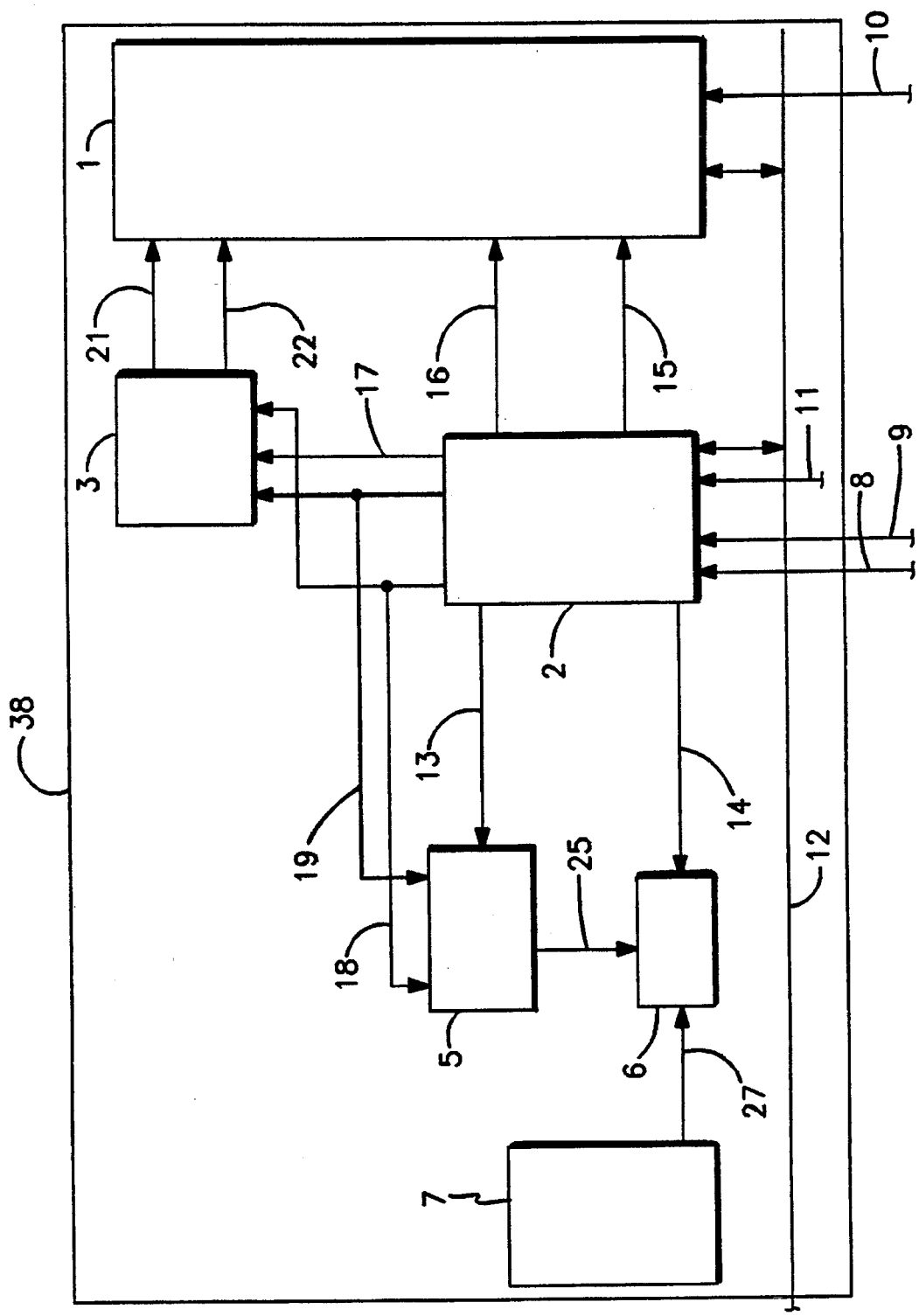
FIG. 7 is a block diagram illustrative of the structure of a novel non-volatile semiconductor memory in a third embodiment according to the present invention.
Figure 8:
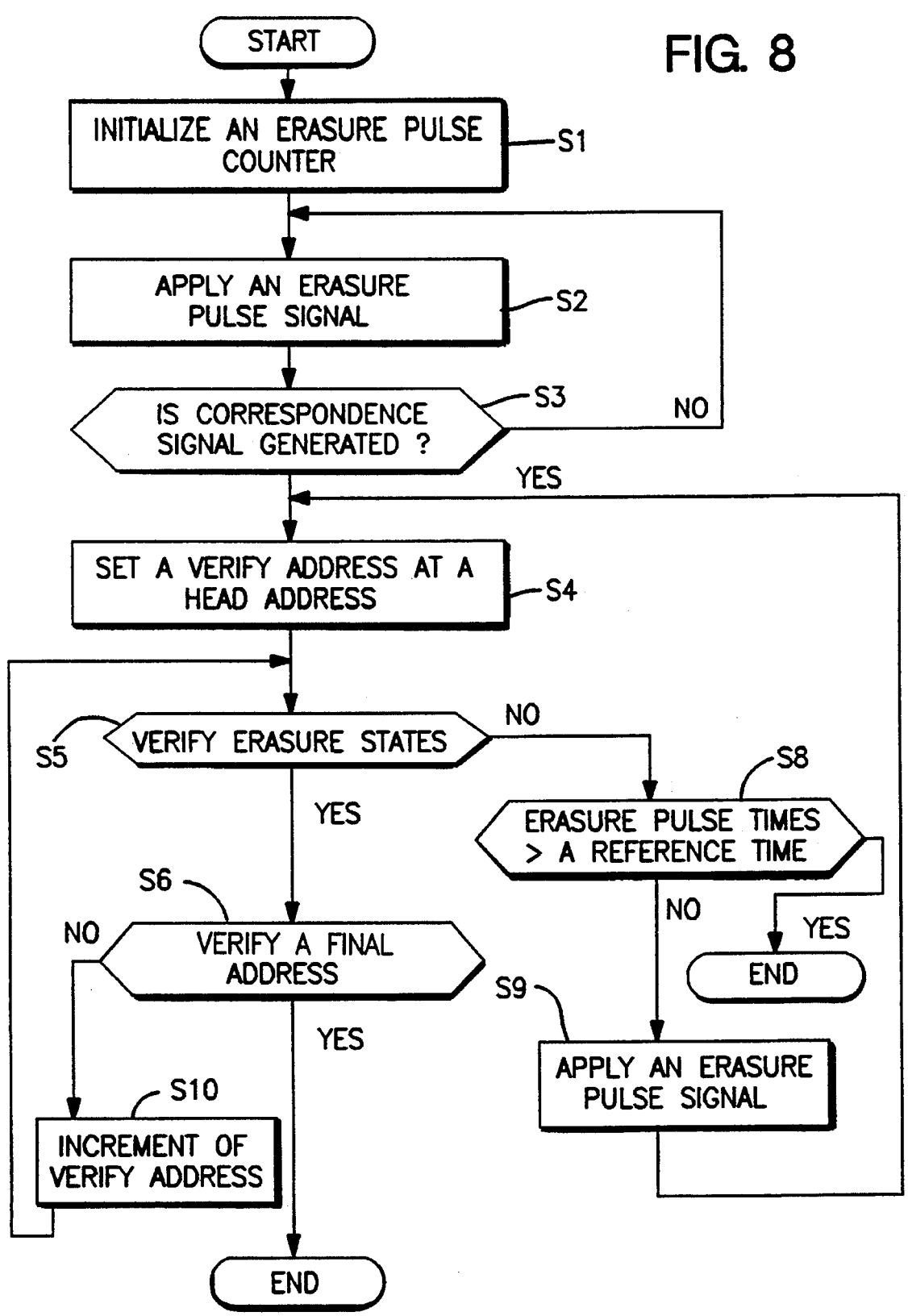
FIG. 8 is a flow chart illustrative of the processes for batch erasure operations of a novel non-volatile semiconductor memory in a third embodiment according to the present invention.

A third embodiment according to the present invention will be described. A configuration of a novel non-volatile semiconductor memory device will hereinafter be described with reference to FIG. 7, from which it is understood that a difference in the configuration of a novel non-volatile semiconductor memory device of the third embodiment from that of the first embodiment would be no provision of the internal write data bus 26 and the second erasure/write signals generator 4, which reason none of the second write signal nor the second erasure signal is applied to the erasure pulse signal application times memory 7. Accordingly, the erasure pulse signal application times memory 7 comprises a read only memory or a programmable read only memory so that there is made no renewal operation for renewing the data concerned with the total number of times of the erasure pulse signal applications once stored in the erasure pulse signal application times memory 7. As a result, the number of steps necessary for implementation of the batch erasure operations can be reduced.

A non-volatile semiconductor memory device 38 includes an electrically erasable and programmable read only memory 1 showing an extremely high speed batch erasure operation wherein all informations stored in all of memory cells provided in the electrically erasable and programmable read only memory 1 are erased. The non-volatile semiconductor memory device 38 further includes first erasing/writing signals generator 3, a control unit 2 for controlling operations of individual elements constituting the non-volatile semiconductor device 38, an erasure pulse application times-counter 5 for counting the number of times of the application of the erasure pulse signals, an erasure pulse signal application times-memory 7 for storing the counted number of times of the erasure pulse signal applications and a comparator 38 for comparing a currently counted total number of times of the erasure/pulse signal applications fetched from the erasure pulse signal application times-counter 5 with a previous total number of times of the erasure pulse signal applications having already been made in the previous batch erasure operation and fetched from the erasure pulse signal application times memory 7 so that the high voltage erasure signal application onto the memory cells is maintained under the control of the control unit 2 without any intervention of the process for verifying the erasure states of all the memory cells, until the currently counted total time corresponds to the reference time.

The electrically erasable and programmable read only memory 1 is coupled to a data bus 12 so that informations stored in a specified one in the memory cells comes into a readout to output onto the data bus 12 which is further coupled to a central processing unit 39 illustrated in FIG. 2. The electrically erasable and programmable read only memory 1 is also coupled to the central processing unit 39 to receive a readout instruction signal 10. The electrically erasable and programmable read only memory 1 is also coupled to the control unit 2 to receive a first readout signal 16 and address informations transferred on an internal address bus 15. When the electrically erasable and programmable read only memory 1 receives any one of the readout instruction signal 10 and the first readout signal 16, the electrically erasable and programmable read only memory 1 performs a readout, onto the data bus 12, of an information stored in a memory cell specified according to the address data that the electrically erasable and programmable read only memory 1 received via the internal data bus 15. The electrically erasable and programmable read only memory 1 is also coupled to the first erasing/writing signals generator 3 to receive a first writing signal 21 and a first erasing signal 22. When the electrically erasable and programmable read only memory 1 receives the first writing signal 21, the electrically erasable and programmable read only memory 1 fetches informations on the data bus 12 and stores the fetched informations into a memory cell specified according to the address data that the electrically erasable and programmable read only memory 1 received via the internal data bus 15. When the electrically erasable and programmable read only memory 1 receives the first erasing signal 21, the electrically erasable and programmable read only memory 1 implements the batch erasing operation to erase all informations stored in all the memory cells regardless of the address informations that the electrically erasable and programmable read only memory 1 received via the internal data bus 15.

The control unit 2 is coupled to the central processing unit 39 to receive a writing instruction signal 8 and an erasing instruction signal 9. The control unit 2 is coupled to the central processing unit 39 via an external address bus 11 on which address informations are transferred between the control unit 2 and the central processing unit 39. The control unit 2 is also coupled to the data bus 12 to output the data onto the data bus 12 and fetch the data from the data bus 12. The control unit 2 is coupled to the erasure pulse signal application times counter 5 to supply an initialization signal 13 to the erasure pulse signal application times counter 5 as well as to supply an erasure control signal 18 and a selective signal 19 to the erasure pulse signal application times-counter 5. The selective signals 19 comprise binary digit signals having valid and invalid levels. When the control unit 2 receives no input of the erasing instruction signal 9, the control unit 2 renders address data of the external address data bus 11 directly output onto the internal address bus 15 on which the address data are transferred into the electrically erasable and programmable read only memory 1. The control unit 2 is further coupled to the first erasing/writing signals generator 3 to supply a writing control signal 17, the erasure control signal 18 and the selection signal 19 into the first erasing/writing signals generator 3. When the control unit 2 receives the input of the write instruction signal 8, the control unit 2 renders the selective signal come into the valid level and further supply the write control signal to the first erasing/writing signals generator 3 for a time corresponding to the predetermined time during which one of the erasing pulse signals is applied to the memory cells in the electrically erasable and programmable read only memory 1. When the control unit 2 receives the input of the erasing instruction signal 9, the control unit 2 shows, with reference to erasure pulse application times data on the count data bus 25, outputs of the address informations onto the internal address bus 15.

The first erasure/write signals generator 3 shows an output of the first write signal 21 only in a time duration when the selective signal 19 is kept in the valid level and the first erasure/write signals generator 3 is kept to receive an input of the write control signal 17. The first erasure/write signals generator 3 also shows an output of the first erasure signal 22 only in a time duration when the selective signal 19 is kept in the valid level and the first erasure/write signals generator 3 is kept to receive an input of the erasure control signal 18.

The erasing pulse application times-counter 5 initializes the counting data stored therein when receiving the initialization signal 13. The erasing pulse application times counter 5 adds "1" into the existent count data only when the selective signal 19 is kept in the invalid level and the erasure pulse application times counter 5 receives the input of the erasure control signal 18 from the control unit 2. The erasure pulse application times counter 5 keeps to output the data as to the counted number of times of applications of the erasure pulse signals onto the count data bus 25 for keeping the comparator informed of the count data.

The erasure pulse signal application times memory 7 keeps the data of the previously stored total number of times of the erasure pulse signal applications stored therein onto the internal readout data bus 27.

The comparator 6 is coupled to the erasure pulse signal application times counter 5 to receive the input of the data concerned with the currently counted number of times of the erasure pulse signal applications supplied from the erasure pulse signal application times counter 5 via the counter data bus 25 so that the comparator 6 is kept informed of the currently counted number of times of the erasure pulse signal applications. The comparator 6 is also coupled to the erasure pulse signal application times memory 7 via the internal readout data bus 27 to receive the input the data concerned with the total number of times of all of the erasure pulse signal applications made in the previous batch erasure operations supplied via the internal readout data bus 27 from the erasure pulse signal application times memory 7. As a result, the comparator 6 can compare the currently counted number of times of the erasure pulse signal applications supplied from the erasure pulse signal application times counter 5 with the total number of times of all of the erasure pulse signal applications made in the previous batch erasure operations from the erasure pulse signal application times memory 7. The comparator 6 is also coupled to the control unit 2 to supply a correspondence signal 14 which comes into an active level only when it is confirmed by the comparison operation that the currently counted number of times of the erasure pulse signal applications corresponds to the total number of times of all of the erasure pulse signal applications made in the previous batch erasure operations.

The following descriptions will focus on the batch erasure operation of the novel non-volatile semiconductor memory device with reference to FIG. 5 which is illustrative of the steps involved in the batch erasure operations in the form of the flow chart. The batch erasure operation starts and then subsequent operations are implemented.

In a first step S1, the control unit 2 outputs the initialization signal 13 which is then transferred to the erasure pulse signal application numbers counter 5 thereby the erasure pulse signal application numbers counter 5 initialize the count data stored therein into "0".

In the second step S2, the control unit 2 set the selective signal 19 into the valid level and further outputs the erasure control signal 18 for a predetermined short time duration. The erasure/write signal generator 3 receives the inputs of the selective signal 19 in the valid level and the erasure control signal 17 and then outputs the first erasure signal 22 for the predetermined short time duration which is transmitted into the electrically erasable and programmable read only memory 1 thereby the first erasure signal 22 is applied for the predetermined short time duration to all of the memory cells provided in the electrically erasable and programmable read only memory 1, resulting in the temporally batch erasure operation of the electrically erasable and programmable read only memory 1 for the predetermined short time duration. The erasure pulse signal application times counter 5 receives inputs of the erasure control signal 18 and the selective signal 19 in the valid level and then add "1" into the previous counted data already stored therein to output the currently counted data onto the count data bus 25 which is connected to the comparator 6.

In the third step S3, the erasure pulse signal application times memory 7 stores therein the total count data stored therein as the total number of times of applications of the erasure pulse signals needed for the completion of the previous batch erasure operation. The erasure pulse signal application times memory 7 outputs the total number of times of the erasure pulse signal applications made until the completion of the previous batch erasure operations for all the memory cells in the electrically erasable and programmable read only memory 1 onto the internal read out data bus 27 which is connected to the comparator 6. The comparator 6 fetches the previous total count data via the internal read out data bus 27 and the currently counted data via the count data bus 25 and then compares the currently counted data of the currently counted number of times of the erasure pulse signal applications made in the present batch erasure operation with the counted previous total number of times of the erasure pulse signal applications made during the previous batch erasure operation. If the comparator 6 verified no correspondence between the currently counted number of times of the erasure pulse signal applications made in the present batch erasure operation and the counted previous total number of times of the erasure pulse signal applications made during the previous batch erasure operation, then the comparator 6 outputs none of the correspondence signal 14 and the process will back to the step S2 so that there is again made the application of the erasure pulse signal for the predetermined short time duration onto all of the memory cells provided in the electrically erasable and programmable read only memory 1 as well as the erasure pulse signal application times counter 5 performs the counting operation to add "1" into the count data. The currently counted data is then compared with the previous total count data by the comparator 6 in the third step S3.

The above steps S2 and S3 will be repeated alternatively until the comparator 6 can verify the correspondence between the currently counted number of times of the erasure pulse signal applications made in the present batch erasure operation. Those means that the erasure pulse signal applications are continuously repeated without implementation of verification of erasable states of all the memory cells provided in the electrically erasable and programmable read only memory 1 until the count number of times of the erasure pulse signal applications corresponds to the previous total number of times of the erasure pulse signal applications made in the previous batch erasure operations.

If the comparator 6 can verify the correspondence between the currently counted number of times of the erasure pulse signal applications made in the present batch erasure operation and the previous total number of times of the erasure pulse signal applications made in the previous batch erasure operation, the comparator 6 outputs the correspondence signal 14 or renders the correspondence signal 14 active which is then transferred into the control unit 2. In this case, the process will progress into the following step in which the control unit 2 verifies the erasure states of the memory cells.

In the fourth step S4, the control unit 2 receives an input of the correspondence signal in the active state and then outputs a head address as a verify address concerned with the batch erasure onto the internal address bus 15 on which the head address is transferred into the electrically erasable and programmable read only memory 1 as well as outputs the first read out signal 16 which is also transferred to the electrically erasable and programmable read only memory 1.

In the fifth step S5, the electrically erasable and programmable read only memory 1 fetches the head address data of the internal address bus 15 to specify a memory cell according to the fetched head address data for subsequent output of data stored in the specified memory cell onto the data bus 12. The data of the specified memory cell is then transferred via the data bus 12 to the control unit 2. The control unit 2 fetches the data of the specified memory cell to verify whether the fetched data associated with the specified memory cell would be the erased-data namely the data after the erasure was implemented. If the verified data would be the erased-data after the erasure operation, the subsequent step will be the step S6. If the verified data would not be the erased-data, the subsequent step will then be the step S8.

In the sixth step S6, the control unit 2 verifies whether the address data fetched from the internal address bus 15 corresponds to the final address concerned with the batch erasure. If the verified address would be the final address, the batch erasure operation will be completed. If the verified address would not be the final address, the subsequent step will be the step S10.

The descriptions will back to the fifth step S5, wherein if the verified data would not be the erased-data, the subsequent step will then be the step S8.

In the step S8, the control unit S2 compares the fetched data concerned with the currently counted number of times of the erasure pulse signal applications with a predetermined reference number which means the maximum number of times for allowing applications of the erasure pulse signals. If the applications of the erasure pulse signals are made beyond the predetermined reference number, the memory cells might be no longer available or operational. If the control unit 2 can verify that the applications of the erasure pulse signals are made beyond the predetermined reference number, the control unit 2 recognizes that the memory cells have been no longer available or operational and thus the processes will be discontinued. If the control unit 2 can verify that the applications of the erasure pulse signals are made below the predetermined reference number, the subsequent step will be the step S9.

In the step S9, the control unit 2 renders the selective signal 19 come active level as well as outputs only one-time the erasure control signal 18 for the predetermined short time duration. The first erasure/write signals generator 3 receives the one-time input of the erasure control signal 18 and then outputs the first erasure pulse signal 22 which is applied onto the memory cells in the electrically erasable and programmable read only memory 1 so that a first time additional batch erasure operation is made after the step S3 in which the continuous applications of the erasure pulse signals were made the same times as those made in the previous batch erasure operation being completed. At the same time, the erasure pulse signal application times counter 5 receives both the erasure control signal 18 for the predetermined short time duration and the selective signal 19 in the active state and then implements the counting operation by adding "1" to the counted data stored therein concerned with the currently counting number of times of the erasure pulse signal applications. The erasure pulse signal application times counter 5 outputs the currently counted data onto the count data bus 25 on which the currently counted data is transferred into the comparator 6. The process will progress to the step S4.

Referring back to the step S4, the control unit 2 again outputs the head address as a verify address concerned with the batch erasure onto the internal address bus 15 on which the head address is transferred into the electrically erasable and programmable read only memory 1 as well as outputs the first read out signal 16 which is also transferred to the electrically erasable and programmable read only memory 1.

Referring back to the step S5 the electrically erasable and programmable read only memory fetches the head address data of the internal address bus 15 to specify a memory cell according to the fetched head address data for subsequent output of data stored in the specified memory cell onto the data bus 12. The data of the specified memory cell is then transferred via the data bus 12 to the control unit 2. The control unit 2 fetches the data of the specified memory cell to verify whether the fetched data associated with the specified memory cell would be the erased-data namely the data after the erasure was implemented. If the verified data would be the erased-data after the erasure operation, the subsequent step will be the step S6. If the verified data would not be the erased-data, the subsequent step will then be the step S8.

Referring back to the step S6, the control unit 2 verifies whether the address data on the internal address data bus 15 be the final address. If the address data on the internal address data bus 15 is the final address, then the process will be completed. If, however, address data on the internal address data bus 15 is not the final address, then the process will progress to the step S10.

In the step S10, the control unit 2 implements an increment associated with the verify address data by adding "1-address" to the verify address data and then outputs the incremented address data onto the internal address bus 15 for subsequent return to the step S5 in which the electrically erasable and programmable read only memory 1 fetches the incremented address data of the internal address bus 15 to specify a memory cell according to the incremented address data for subsequent output of data stored in the specified memory, cell onto the data bus 12. The data of the specified memory cell is then transferred via the data bus 12 to the control unit 2. The control unit 2 fetches the data of the specified memory cell to verify whether the fetched data associated with the specified memory cell would be the erased-data namely the data after the erasure was implemented. If the verified data would be the erased-data after the erasure operation, the subsequent step will be the step S6.

If the verified address would be the final address, the process will be completed. If the verified address would not be the final address, the subsequent step will be the step S10.

According to the above descriptions of the novel non-volatile semiconductor memory with an electrically erasable and programmable read only memory, the applications of the erasure pulse signals, each of which is made for the predetermined short time duration, are continuously made, the same times or for the same time period as those made in the previous batch erasure operation having been completed, without implementation of verification operation for verifying the erasure states of all the memory cells in the electrically erasable and programmable read only memory 1. If it can be verified that all data stored in all the memory cells provided in the electrical erasable and programmable read only memory 1 are erased, then the batch erasure operation is completed. In this case, no intermediate verifying process is made. As a result, the times consumed for the completion of the batch erasure operation in the above third embodiment is only about a half of the times necessary in the conventional batch erasure operation as described above.

If it can not be verified that all data stored in all the memory cells provided in the electrical erasable and programmable read only memory 1 are erased, then the application of the erasure pulse signal and subsequent verifying process for verifying the erasure states of all the memory cells in the electrically erasable and programmable read only memory are alternatively repeated until it can be verified that all data stored in all the memory cells provided in the electrical erasable and programmable read only memory 1 are erased. As a result, the number of times of the verifying process for verifying the erasure states of all the memory cells in the electrically erasable and programmable read only memory is considerable reduced relative to the conventional process.

When the power voltage is constant, the application time period in which the erasure signals are applied onto the memory cells, shows a simple increase as the number of times of the erasure pulse signal applications made are increased. This ensures that the continuous applications of the erasure pulse signals the same times or the same time period as those made in the previous batch erasure operation may render the memory cells in the electrically erasable and programmable read only memory free from any excess erasure state causing no availability of the memory cells. This means that the reliability of the electrically erasable and programmable read only memory is kept, although the times needed for the completion of the batch erasure operation is considerably reduced relative to the conventional process.

There was confirmed the fact that the time necessary for implementation of the additional erasure pulse signal applications in the step S9 after the continuous erasure pulse signal applications of the same times as those made in the previous batch erasure operation would correspond almost to the predetermined short time duration, for example, 10 milliseconds in which the erasure pulse signal application can be made one time. This means that the additional erasure pulse signal applications in the step S9 would be one time in the average, whereas the number of times of the continuous erasure pulse signal applications made in the step S3 is fifty times in the average.

Accordingly, the erasure pulse signal application times memory 7 comprises a read only memory or a programmable read only memory so that there is made no renewal operation for renewing the data concerned with the total number of times of the erasure pulse signal applications once stored in the erasure pulse signal application times memory 7. As a result, the number of steps necessary for implementation of the batch erasure operations can be reduced thereby a further reduction of the time consumed for the implementation of the batch erasure operation may be achieved.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the spirit and scope of the present invention.

What is claimed is:

1. A non-volatile semiconductor memory device showing a high speed batch erasure operation, said device comprising:

an electrically erasable and programmable read only memory including memory cells;

means coupled to said electrically erasable and programmable read only memory for generating erasure pulse signals to be applied onto said memory cells;

means coupled to said erasure pulse signal generation means for controlling operations of erasure pulse signal generations by supplying erasure control signals to said erasure pulse signal generation means;

means for storing a predetermined reference number of times of erasure pulse signal applications, said predetermined reference number being set to correspond to an estimated number of times of the erasure pulse signal applications necessary for completing the batch erasure operation;

means coupled to said control means for counting the number of times of erasure pulse signal applications currently made onto said memory cells by fetching said erasure control signals from said control means; and means coupled to both said storing means and said counting means for comparing said counted number of times of erasure pulse signal applications currently made and fetched from said counting means with said predetermined reference number fetched from said storing means and then outputting a correspondence signal to be supplied to said control means only when said counted number of times of erasure pulse signal applications corresponds to said predetermined reference number, whereby:

said control means implements processes comprising the steps of:
      continuing applications of said erasure pulse signals onto said memory cells until said control means receives said correspondence signal from said comparator; and
      repeating a set of an additional erasure pulse signal application onto said memory cells and a verifying process for verifying erasure states of all said memory cells until said control means can verify the fact that all said memory cells have been in erasure states.

2. The device as claimed in claim 1, wherein said estimated number stored in said storing means is set to correspond to a total number of times of erasure pulse signal applications made in the previous batch erasure operation having already been completed.

3. The device as claimed in claim 2, wherein said estimated number stored in said storing means is renewed to correspond to said total number of times of erasure pulse signal applications made in the previous batch erasure operation having already been completed only when said total number is changed.

4. The device as claimed in claim 1, wherein said estimated number stored in said storing means is kept constant during said batch erasure operation and said estimated number being set prior to commencement of said bath erasure operation.

5. The device as claimed in claim 1, further comprising means coupled between said storing means and said comparator for translating said predetermined reference number according to a translation table to reduce said predetermined reference number thereby said comparing means fetches said reduced number from said predetermined reference number.

6. The device as claimed in claim 3, further comprising means coupled to said storing means and said control means for renewing said estimated number stored in said storing means to correspond to said total number of times of erasure pulse signal applications made in the previous batch erasure operation just having been completed only when said total number is changed.

* * * * *